(12) United States Patent
Koyama et al.

(10) Patent No.: US 6,927,753 B2
(45) Date of Patent: Aug. 9, 2005

(54) DISPLAY DEVICE

(75) Inventors: Jun Koyama, Kanagawa (JP); Yoshifumi Tanada, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 300 days.

(21) Appl. No.: 09/985,397

(22) Filed: Nov. 2, 2001

(65) Prior Publication Data

US 2002/0054009 A1 May 9, 2002

(30) Foreign Application Priority Data

Nov. 7, 2000 (JP) ........................................ 2000-339742

(51) Int. Cl.[7] .............................. G09G 3/36; G09G 5/00
(52) U.S. Cl. ........................ 345/100; 345/98; 345/212
(58) Field of Search .................. 345/89–104, 211–215, 345/204–206, 55; 377/64

(56) References Cited

U.S. PATENT DOCUMENTS

| | | | | | |
|---|---|---|---|---|---|
| 5,103,218 A | * | 4/1992 | Takeda | ........................ | 345/100 |
| 5,336,939 A | * | 8/1994 | Eitrheim et al. | ............. | 327/291 |
| 5,369,417 A | * | 11/1994 | Tanaka | ........................ | 345/98 |
| 5,477,073 A | * | 12/1995 | Wakai et al. | ................ | 257/347 |
| 5,546,102 A | * | 8/1996 | Scheffer et al. | ............. | 345/100 |
| 5,850,204 A | * | 12/1998 | Maekawa | ..................... | 345/98 |
| 5,889,504 A | * | 3/1999 | Kihara et al. | ................ | 345/100 |
| 5,907,313 A | | 5/1999 | Kubota et al. | | |
| 5,909,199 A | * | 6/1999 | Miyazaki et al. | ............. | 345/60 |
| 5,929,464 A | | 7/1999 | Yamazaki et al. | | |
| 5,936,698 A | | 8/1999 | Koyama | | |
| 6,049,318 A | * | 4/2000 | Ota | ............................. | 345/93 |
| 6,081,131 A | * | 6/2000 | Ishii | ............................ | 326/68 |
| 6,157,361 A | * | 12/2000 | Kubota et al. | ............. | 345/100 |
| 6,162,704 A | | 12/2000 | Yamazaki et al. | | |
| 6,175,352 B1 | * | 1/2001 | Kay et al. | ................... | 345/100 |
| 6,177,920 B1 | | 1/2001 | Koyama et al. | | |
| 6,281,890 B1 | * | 8/2001 | Ito | .............................. | 345/204 |

* cited by examiner

Primary Examiner—Dennis-Doon Chow
Assistant Examiner—Leland R. Jorgensen
(74) Attorney, Agent, or Firm—Eric J. Robinson; Robinson Intellectual Property Law Office, P.C.

(57) ABSTRACT

Power consumption is reduced in a driving circuit of a display device capable of handling a low voltage amplitude input signal by employing level shifters that utilize a differential amplifier. The driving circuit is divided into a plurality of units and each unit is provided with a constant current source. In addition to a usual scanning circuit, there is provided a sub-scanning circuit for controlling ON/OFF of the constant current source arranged in each unit. The sub-scanning circuit turns ON only the constant current sources in the unit that is being scanned. A current thus can be supplied efficiently.

29 Claims, 16 Drawing Sheets

11 : start pulse 1
12 : clock signal
13 : clock signal (inverted)
14 : start pulse 2
15 : digital video signal (red)
16 : digial video signal (green)
17 : digital video signal (blue)
18 : latch pulse

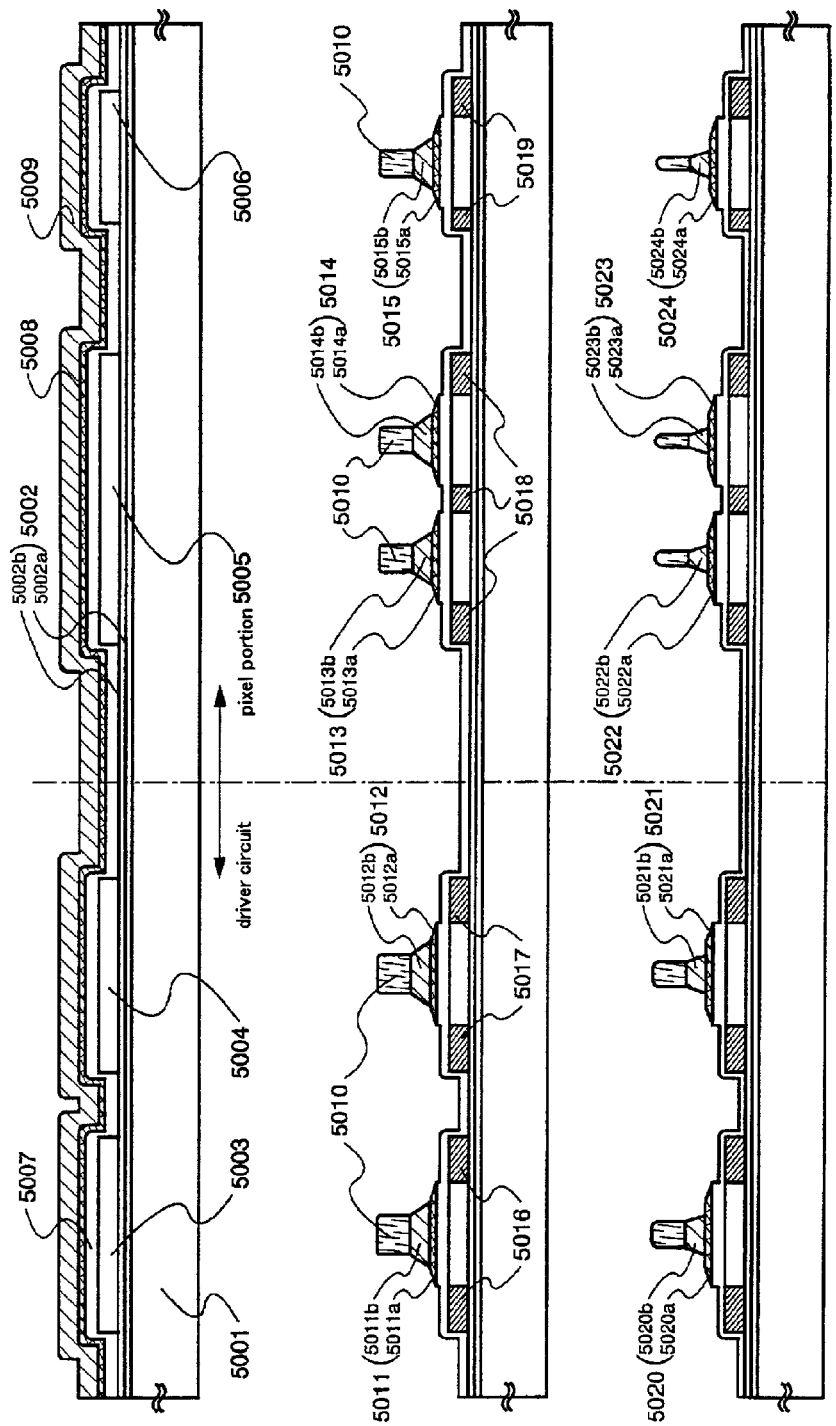

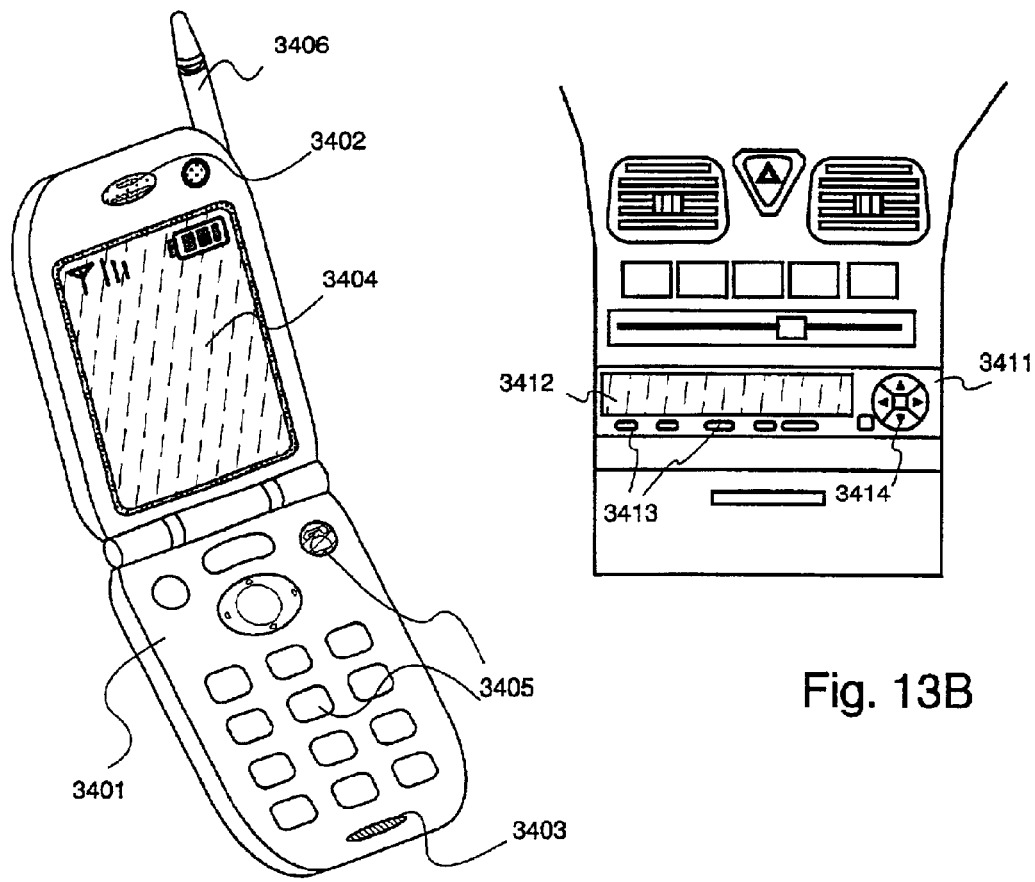
Fig. 13A
Fig. 13B
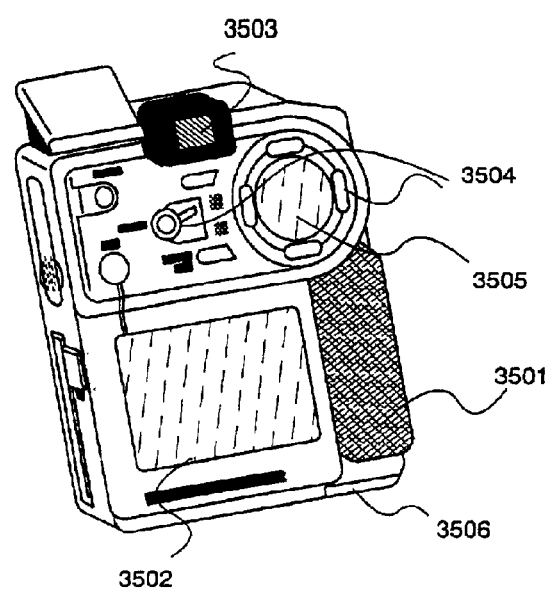
Fig. 13C

DISPLAY DEVICE

BACKGROUND OF THE INVENTION

1. Field of the Invention

The present invention relates to a display device and a driving circuit of the display device. More specifically, the present invention relates to an active matrix display device having a thin film transistor (TFT) that is formed on an insulator and to a driving circuit of the active matrix display device.

2. Description of the Related Art

In recent years, semiconductor manufacture technologies have advanced and become capable of handling even more minute devices. Accordingly, LSI thus reduced in size is applied to small equipment such as portable information terminals and is required to cut power consumption. The current mainstream LSI is a low power voltage drive LSI that can be driven at about 3.3 V. On the other hand, LCDs (liquid crystal displays), which have lately been in increasingly greater demand as display units for portable information terminals and as computer monitors, drive their liquid crystals often with a signal having a voltage amplitude of 10 V to 20 V, and a driving circuit for driving them has at least a circuit portion driven at an accordingly high power voltage. When a controller LSI driven at a low power voltage around 3.3 V is connected to a liquid crystal driving circuit driven at a high power voltage, a level shifter that changes the amplitude of signal voltage is therefore indispensable.

Demands for reduced drive voltage is strong not only in LCDs but also in EL (electroluminescence: here including both singlet excitation light emission and triplet excitation light emission) displays, which have been developed recently.

FIG. 6 shows an example of a circuit diagram of a source signal line driving circuit in a display device. This source signal line driving circuit has level shifters 601 to 604, an input signal buffer 605, shift registers 606, NAND circuits 607, buffers 608, first latch circuits 609, and second latch circuits 610. The driving circuit is connected to a pixel 611. The buffers 608 may be omitted or arranged so as to suit the logic of a signal. A start pulse, a clock signal, a digital video signal and the like are inputted to the display device from the external. These signals are supplied from the controller LSI described above (not shown) and, therefore, generally have a low voltage amplitude around 3.3 V when supplied. In the driving circuit shown in FIG. 6, signals inputted from the external controller LSI, such as a clock signal, a start pulse, and a digital video signal, are subjected to voltage amplitude conversion (level conversion) in the level shifters 601 to 604 immediately after they are inputted. The input signal buffer 605 is placed near a point where the clock signal is inputted in order to prevent dulled waveform due to a large load on a clock signal line. Another measure to prevent dulled clock signal is to subject the clock signal to a level conversion in level shifters (denoted by 701 in FIG. 7) that are placed immediately before the shift registers of the respective stages.

The operation of the driving circuit will be described. Since the circuit structures shown in FIGS. 6 and 7 are identical with each other except the clock signal level conversion measures, the description on the operation will be given referring only to FIG. 6. The shift registers 606 output pulses in response to a clock signal and a start pulse and pulses of adjacent two stages are inputted to the NAND circuit 607. The NAND circuit 607 outputs a pulse obtained by logical addition of the inputted two signals and the pulse serves as a first latch pulse. The first latch pulse passes through the buffers 608 and is inputted to the latch circuit 609. In accordance with an input-timing of the first latch pulse, a latch operation of a digital video signal that has been subjected to level conversion by the level shifter 603 is carried out. After the latch operation is completed for the first stage through the last stage, a second latch pulse is inputted to an input terminal 7 during a retrace period and the digital video signals equivalent of one horizontal period which have been held in the first latch circuits 609 are all sent to the second latch circuits 610 at once. Then the signals are written in the pixel 611 and other pixels on the same row where a gate signal line (gate line) is selected, whereby an image is displayed.

FIG. 3A shows an example in which conventional level shifters are used for the level shifters 601 to 604 in FIG. 6 and for level shifters 701 to 704 in FIG. 7. In FIG. 3A, 'In' denotes an input signal and 'Out' denotes an output signal. 'Inb' denotes an inversion signal of the input signal and the inversion signal is generated from the In signal by an inverter or the like. In the thus structured level shifters, when the voltage amplitude of the input signals (In and Inb) is as small as 3.3 V, normal level conversion may be inhibited by the influence of the threshold of TFTs constituting the level shifters.

Then level shifters structured as shown in FIG. 3B are employed. The level shifters in FIG. 3B use a differential amplifier for level conversion, so that level conversion is performed on input signals without fail even when the input signals have a small voltage amplitude. Therefore they are very effective in reducing the drive voltage of the circuit.

However, the level shifters utilizing a differential amplifier need a constant current source 301 (Sup.) as shown in FIG. 3B so that a constant current is kept supplied during the circuit is in operation. These level shifters thus consume larger power than conventional level shifters and are disadvantageous as components mounted to mobile equipment etc. Another drawback of them is that they require a large-sized buffer to be arranged downstream. In various mobile equipment, whose popularity has surged lately, the need for smaller-sized and lighter-weight equipment has never been more pressing and to let power consumption and circuit area increase by employing a device capable of lowering drive voltage is putting the cart before the horse.

SUMMARY OF THE INVENTION

The present invention has been made in view of the above problems and an object of the present invention is therefore to provide a driving circuit for a display device which can deal with a peripheral circuit of reduced drive voltage and can reduce current consumption.

In order to attain the object above, the present invention takes following measures.

In the source signal line driving circuits shown in FIGS. 6 and 7, a constant current is kept supplied to the level shifters regardless of whether there are pulses outputted from the shift registers or not and whether a video signal is inputted or not. Then the present invention divides a driving circuit into a suitable number of stages. In addition to a first scanning circuit that has a shift register for outputting a first latch pulse, there is provided a second scanning circuit (hereinafter referred to as sub-scanning circuit) having a shift register that operates at a slower speed. An output pulse from the sub-scanning circuit is used to control the ON/OFF operation of a current source for supplying a current to a level shifter that is arranged in each block. With this structure, the constant current source that could otherwise be the cause of large power consumption supplies a current only to a portion where it is necessary, thereby greatly reducing power consumption. Furthermore, the sub-scanning circuit used to control the constant current source operates at a slow speed and therefore hardly increases power consumption.

Hereinafter, description will be made of the structures of the display device in accordance with the present invention.

According to a first characteristic of the present invention, there is provided a display device having a driving circuit and a pixel portion, wherein the driving circuit has a first scanning circuit and a second scanning circuit, wherein the first scanning circuit has at least a shift register, at least a level shifter, and at least a constant current source, the shift register sequentially outputting pulses in response to a first clock signal, the level shifter converting the voltage amplitude of a signal inputted, the constant current source supplying a current to the level shifter, wherein the second scanning circuit has at least a shift register for sequentially outputting pulses in response to a second clock signal, and wherein the constant current source supplies a current only while the pulses sequentially outputted from the second scanning circuit are inputted to the constant current source.

According to a second characteristic of the present invention, there is provided a display device having a driving circuit and a pixel portion, wherein the driving circuit has a first scanning circuit and a second scanning circuit, wherein the first scanning circuit has first to x-th stages of units (x stages in total, x is a natural number and satisfies $x \geq 2$), wherein the x stages of units each have at least a shift register, at least a level shifter, and at least a constant current source, the shift register sequentially outputting pulses in response to a first clock signal, the level shifter converting the voltage amplitude of a signal inputted, the constant current source supplying a current to the level shifter, wherein the second scanning circuit has at least a shift register for sequentially outputting pulses in response to a second clock signal, and wherein the constant current source in the a-th stage unit (a is a natural number and satisfies $1 \leq a \leq x$) supplies a current only while the pulses sequentially outputted from the second scanning circuit are inputted to the constant current source in the a-th stage unit.

In addition to the first or second characteristic of the present invention, the display device of the present invention is characterized in that the frequency of the second clock signal is lower than the frequency of the first clock signal.

In addition to the first or second characteristic of the present invention, the display device of the present invention may have a structure such that the second clock signal is generated from the first clock signal by an internal frequency divider circuit.

According to a third characteristic of the present invention, there is provided a display device having a driving circuit and a pixel portion, wherein the driving circuit has a scanning circuit and a selecting circuit, wherein the scanning circuit has at least a shift register, at least a level shifter, and at least a constant current source, the shift register sequentially outputting pulses in response to a clock signal, the level shifter converting the voltage amplitude of a signal inputted, the constant current source supplying a current to the level shifter, wherein the selecting circuit has a decoder that outputs a selecting pulse to an arbitrary terminal out of a plurality of output terminals upon input of a selecting signal, and wherein the constant current source supplies a current only while the selecting pulse is inputted from the decoder to the constant current source.

According to a fourth characteristic of the present invention, there is provided a display device having a driving circuit and a pixel portion, wherein the driving circuit has a scanning circuit and a selecting circuit, wherein the scanning circuit has first to x-th stages of units (x stages in total, x is a natural number and satisfies $x \geq 2$), wherein the x stages of units each have at least a shift register, at least a level shifter, and at least a constant current source, the shift register sequentially outputting pulses in response to a clock signal, the level shifter converting the voltage amplitude of a signal inputted, the constant current source supplying a current to the level shifter, wherein the selecting circuit has a decoder that outputs a selecting pulse to an arbitrary terminal out of a plurality of output terminals upon input of a selecting signal, wherein each of the plural output terminals of the decoder is connected to the constant current source in one of the units, with no two terminals being connected to the constant current source in the unit of the same stage, and wherein the constant current source in the a-th stage unit (a is a natural number and satisfies $1 \leq a \leq x$) supplies a current only while the selecting pulse is inputted from the decoder to the constant current source in the a-th stage unit.

According to a fifth characteristic of the present invention, there is provided a display device having a driving circuit and a pixel portion, wherein the driving circuit has a scanning circuit and a selecting circuit, wherein the scanning circuit has first to x-th stages of units (x stages in total, x is a natural number and satisfies $x \geq 2$), wherein the x stages of units each have at least a shift register, at least a level shifter, at least a constant current source, and a constant current source switch circuit, the shift register sequentially outputting pulses in response to a clock signal, the level shifter converting the voltage amplitude of a signal inputted, the constant current source supplying a current to the level shifter, the constant current source switch circuit inputting a pulse to the constant current source to control a current supply period and a current stop period, wherein the selecting circuit has a decoder that outputs a selecting pulse to an arbitrary terminal out of a plurality of output terminals upon input of a selecting signal, wherein the constant current source switch circuit in the a-th stage unit (a is a natural number and satisfies $1 \leq a \leq x$) outputs a pulse to the constant current source in the a-th stage unit only while one of selecting pulses outputted from the decoder is inputted or an output pulse from the last stage shift register in the (a−1)-th unit is inputted, and wherein the constant current source in the a-th stage unit supplies a current only while a pulse is inputted from the constant current source switch circuit in the a-th stage unit.

In addition to the above-mentioned characteristics of the present invention, the display device of the present invention may have a structure such that a substrate selected from the group consisting of a glass substrate, a plastic substrate, a stainless steel substrate, and a single crystal wafer is provided.

In addition to the above-mentioned characteristics of the present invention, the display device of the present invention may have a structure such that the driving circuit and the pixel portion are formed on the same substrate integrally.

In addition to the above-mentioned characteristics of the present invention, the display device of the present invention may have a structure such that the driving circuit and the pixel portion are formed on different substrates.

BRIEF DESCRIPTION OF THE DRAWINGS

In the accompanying drawings:

FIGS. 8A to 8C are diagrams showing an example of a process of manufacturing a display device;

FIGS. 13A to 13C are diagrams showing examples of applying a display device of the present invention to electronic equipment;

DETAILED DESCRIPTION OF THE PREFERRED EMBODIMENTS

Embodiment Mode

Figure 1:
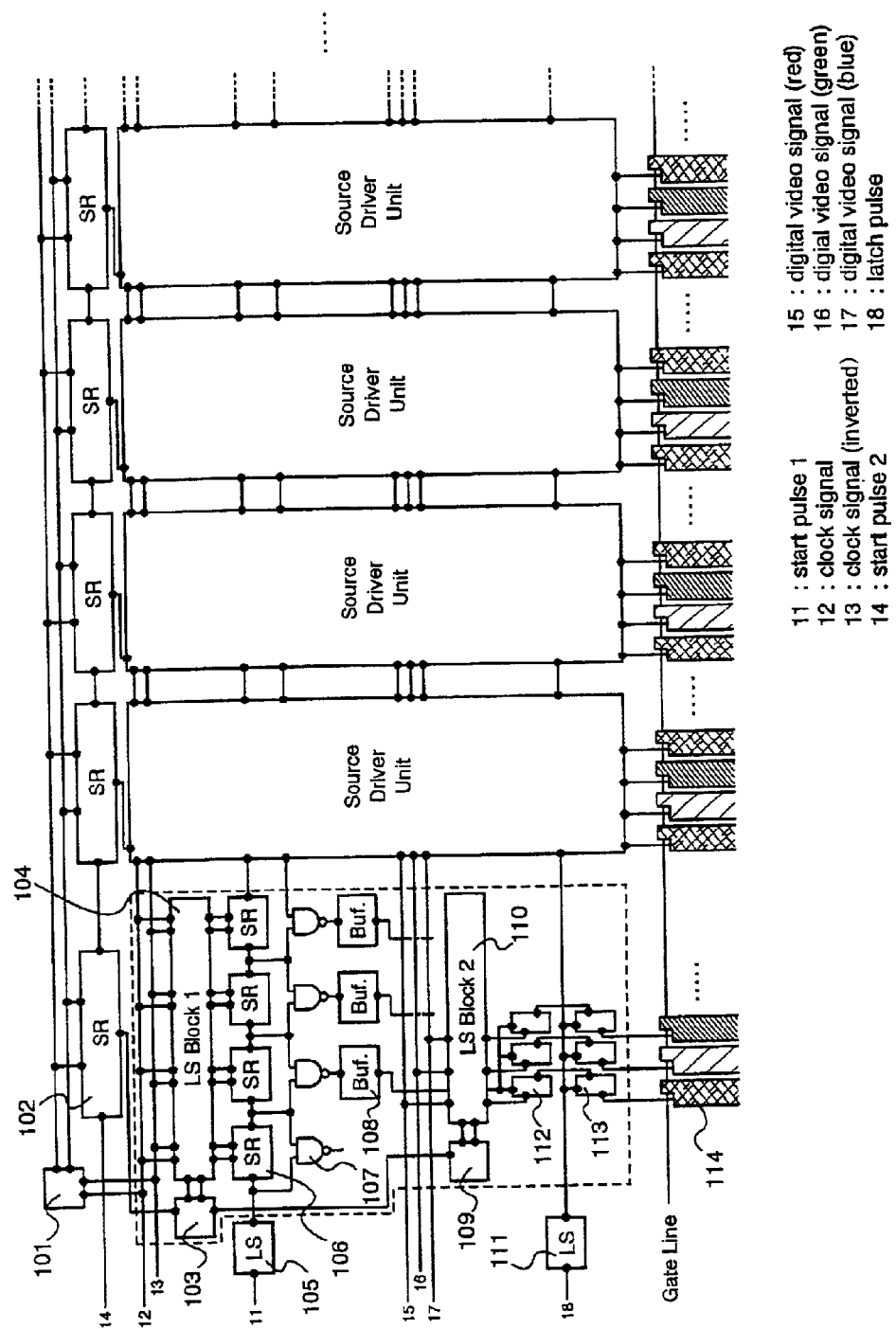
FIG. 1 is a diagram showing the structure of a digital driving circuit of a display device according to the present invention.

FIG. 1 is a diagram showing one structural mode of a driving circuit in a display device according to the present invention. A source signal line driving circuit is divided into a suitable number of stages and each division unit is provided with a constant current source 103 for supplying a current to level shifters. Each division unit (a section surrounded by a dotted line in FIG. 1 and hereinafter will be called a unit) has the constant current source 103, a constant current source 109, level shifters 104, 105, 110, and 111, first shift registers 106, NAND circuits 107, buffers 108, first latch circuits 112, second latch circuits 113, etc. One unit forms one stage and as many stages as necessary are provided to constitute the source signal line driving circuit. The level shifters 105 and 111 are each single members and they merely increase power consumption to an ignorable degree. Therefore the level shifters 105 and 111 have current sources individually and operate individually. The level shifters 104 and 110 are each a group of level shifters. Each group has a number of level shifters which corresponds to a number of input signals that need level conversion in the respective units. These level shifters are supplied with a constant current by the constant current sources 103 and 109. The driving circuit of the display device according to the present invention also has a sub-scanning circuit. The sub-scanning circuit has second shift registers 102 for controlling ON/OFF of the constant current sources 103 and 109 that are provided in each unit. The second shift registers 102 have less stages than the first shift registers 106 and therefore may operate at a slower speed. For example, there are four stages of first shift registers 106 in one unit in FIG. 1, and the second shift registers 102 accordingly operate at a frequency which is about ¼ of the operation frequency of the first shift registers 106.

However, no particular limitation is put on the relation among the operation clock frequency and the number of stages of the first shift registers 106 and the number of stages of the second shift registers 102, since the main feature of the present invention is to divide a source signal line driving circuit into a plurality of units and use a sub-scanning circuit to control ON/OFF of constant current sources provided in the respective units.

Figure 4:
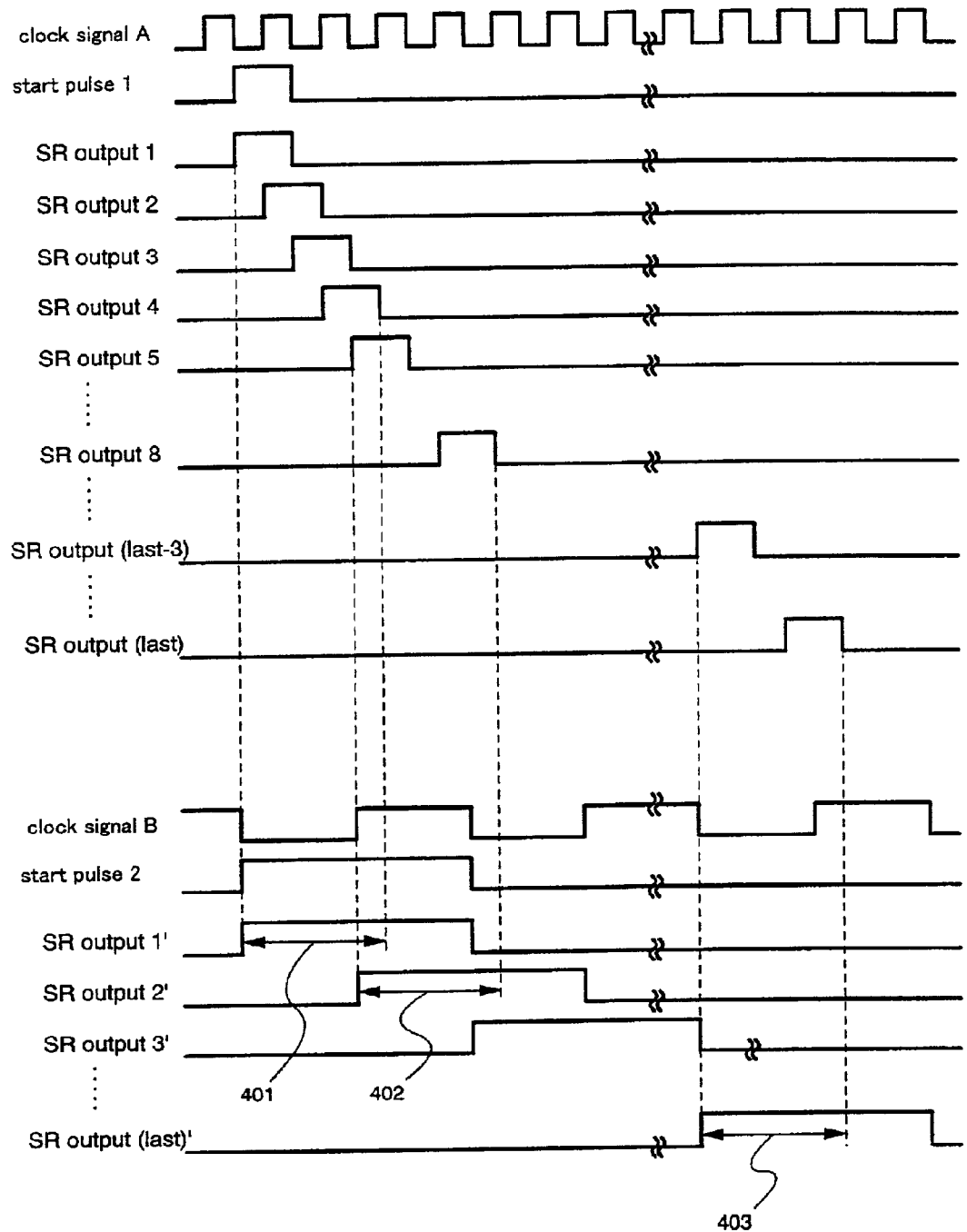
FIG. 4 is a timing chart of the operation of a circuit in accordance with an embodiment mode of the present invention.

Now, a description will be given on the operation of the driving circuit of FIG. 1 in the display device according to the present invention. A simplified timing chart is shown in FIG. 4. Signals are inputted to input terminals denoted by 11 to 18 in FIG. 1.

A first clock signal ('Clock Signal A' in FIG. 4) is inputted through the input terminals 12 and 13. The clock signal A is inputted to a frequency divider circuit 101 and the level shifter 104. The frequency divider circuit 101 generates, from the clock signal A, a second clock signal ('Clock Signal B' in FIG. 4) having a lower frequency. The clock signal B is inputted to the second shift registers 102.

Subsequently, a start pulse ('Start Pulse 2' in FIGS. 1 and 4) is inputted to the input terminal 14 and, together with the clock signal B, puts the second shift registers 102 into operation so that the second shift registers 102 output pulses. The pulses are inputted to the constant current sources 103 and 109, which supply a constant current to the level shifters 104 and 110 only while the pulses are inputted thereto.

On the other hand, the clock signal A inputted to the level shifter 104 is subjected here to level conversion and then inputted to the first shift registers 106. A start pulse ('Start Pulse 1' in FIGS. 1 and 4) is inputted through the input terminal 11, receives level conversion in the level shifter 105, and is inputted to the first shift registers 106. The start pulse 1 and the clock signal A put the first shift registers 106 into operation and the first shift registers 106 output pulses sequentially.

The pulses sequentially outputted from the first shift registers 106 are inputted to the NAND circuits 107. When adjacent two pulses both have Hi electric potential, the NAND circuits output pulses of Lo electric potential to be inputted to the buffers 108. The pulses inputted to the buffers 108 are then inputted as first latch pulses to the first latch circuits 112.

Digital video signals respectively corresponding to R, G, and B are inputted through the input terminals 15 to 17 to the level shifter 110. At this point, the constant current source 109 is in operation and is supplying a constant current to the level shifter 110. Therefore the digital video signals are immediately subjected to level conversion and inputted to the first latch circuits 112. In timing with the input of the first latch pulses described above, the digital video signals are held sequentially.

When the first latch circuit at the last stage finishes holding operation in the first stage unit, similar operations are started in the second stage unit. Simultaneously, the second shift registers output pulses of the next stage to supply a constant current to the level shifters of the second stage unit. This operation is repeated until digital video signals equivalent of one horizontal period are held in the first latch circuits 112.

Thereafter, second latch pulses are inputted through the input terminal 18, receive level conversion in the level shifter 111, and then are inputted to the second latch circuits 113. Upon input of the converted second latch pulses to the second latch circuit 113, the digital video signals that have been held in the first latch circuits 112 are all sent to the second latch circuits 113 at once. The signals are then written in a pixel 114 and other pixels on the same row where a gate signal line (gate line) is selected. An image is displayed by repeating this series of operations.

Though not shown in FIG. 1, it is common to convert digital video signals into analog signals using a D/A converter circuit before the signals are written in pixels.

'SR Output #' (# is a natural number) in FIG. 4 is an output of one of the second shift registers of the first stage, the second stage, the third stage, . . . and the last stage. The constant current sources provided in the respective units supply a current to the level shifters only while the pulses are outputted. A period denoted by 401 starts as the first shift register at the first stage is put into operation in the first stage unit and ends as the first shift register at the last stage in the same unit finishes outputting (here, the first shift register at the last stage is the one at the fourth stage since in the unit there are four stages of first shift registers in FIGS. 1 and 4. Of course, no limitation is put on how many stages of first shift registers are to be provided in one unit.). In the period 401, a current is supplied normally. Similarly, the constant current sources in the respective units supply a current to the level shifters normally during periods 402 and 403.

The sub-scanning circuit in this embodiment mode is composed of shift registers to make the current supply continue for a while after all the first shift registers in a certain unit stop operating upon overlap of output pulses from the second shift registers. If this causes some delay before the video signal latch operation is started after the shift registers stop operating, no problem arises since the level shifter 110 is well in operation period. Desirably, the second shift registers are put into operation slightly earlier than the time the first shift registers start operating, so that the clock signal A to be inputted to the first shift register at the first stage is subjected to level conversion without fail. By allowing an enough margin between any two occurrences in this way, failure in performing level conversion on respective input signals by missing the timing to turn the constant current source ON due to dulled or delayed output pulses or like other problems can be avoided.

In this embodiment mode, the clock signal B is generated from the clock signal A by the frequency divider circuit 101 and the start pulses 1 and 2 are individually inputted. However, the present invention is not limited thereto. That is, the clock signal may be independent and inputted from the external and a circuit for generating one start pulse from the other start pulse may be provided.

Although the description in this specification is given taking as an example the case where the driving circuit is a source signal line driving circuit to explain the present invention, the present invention can readily be applied to a gate signal line driving circuit.

Embodiments of the present invention will be described below.

Embodiment 1

Figure 2:
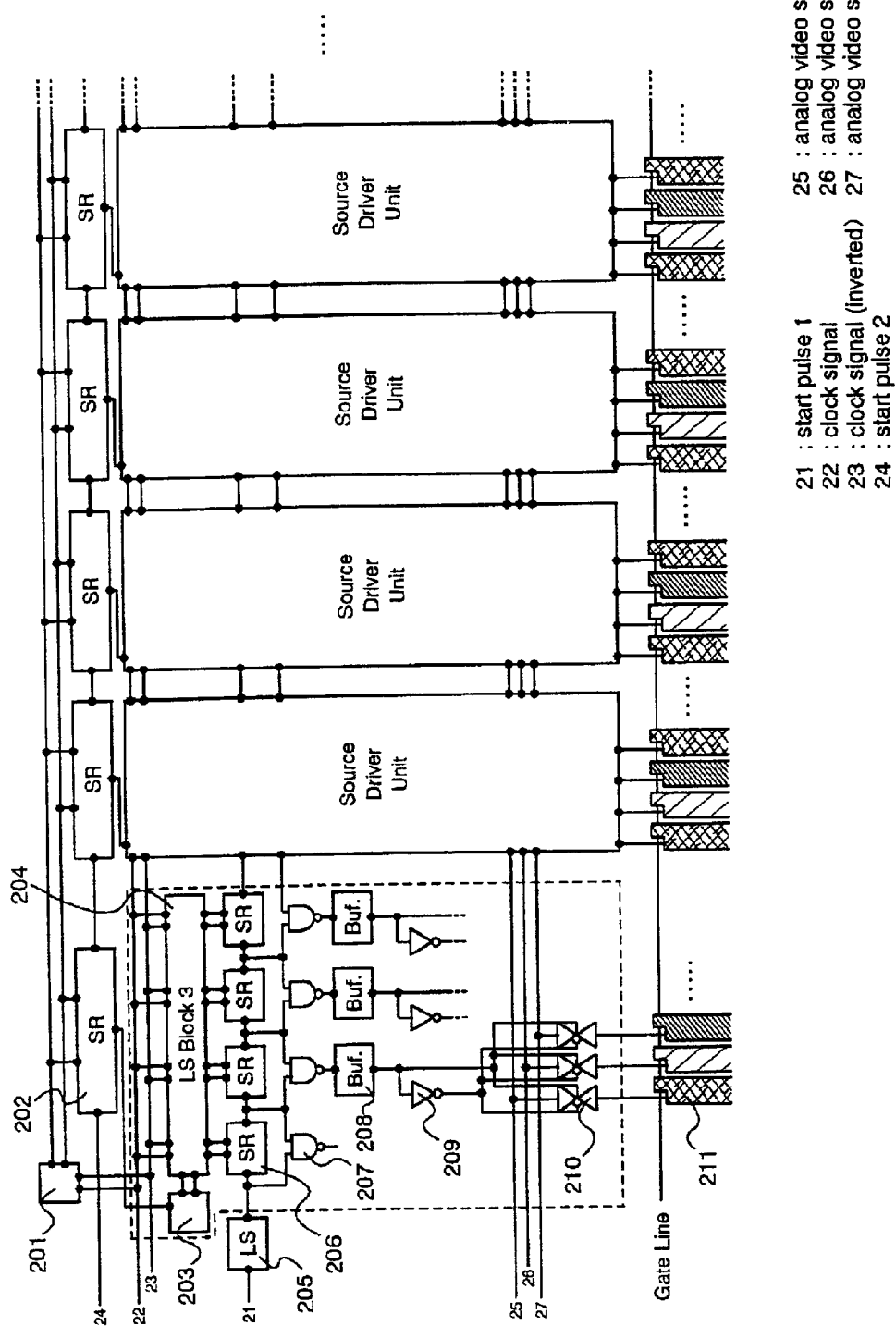
FIG. 2 is a diagram showing the structure of an analog driving circuit of a display device according to the present invention.
Figure 3A:
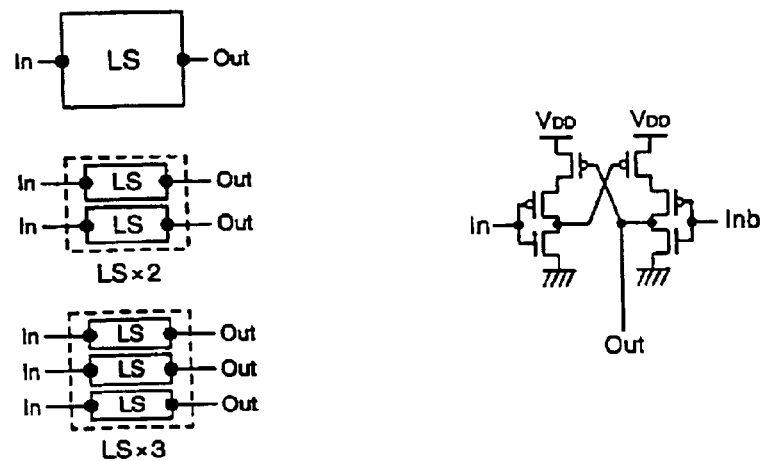
FIGS. 3A and 3B are a diagram showing ordinary level shifters and a diagram showing level shifters which use a differential amplifier, respectively.
Figure 3B:
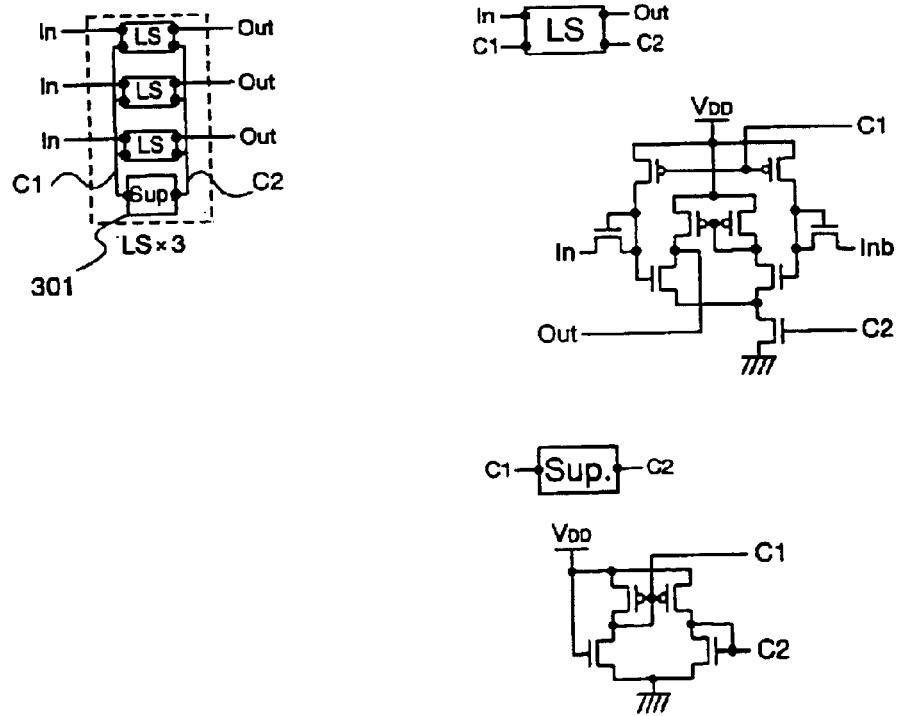

The driving circuit described in Embodiment Mode above is one that receives a digital video signal. The present invention is also applicable to a display device that uses an analog video signal. FIG. 2 shows a case of embodying the present invention as a source signal line driving circuit in a display device that uses an analog video signal. Analog video signals respectively corresponding to R, G, and B are inputted through input terminals 25 to 27.

Similar to the one shown in Embodiment Mode, the source signal line driving circuit of FIG. 2 is divided into units forming a suitable number of stages and each unit is provided with a constant current source 203 for supplying a current to level shifters. Each unit has the constant current source 203, level shifters 204 and 205, first shift registers 206, NAND circuits 207, buffers 208, sampling switches 210, etc. The level shifter 204 is a group of level shifters. The group has a number of level shifters which corresponds to a number of input signals that need level conversion in the respective units. These level shifters are supplied with a constant current by the constant current source 203. Also, the second shift registers 202 for controlling ON/OFF of the constant current source 203 that is provided in each unit are provided. The second shift registers 202 have less stages than the first shift registers 206 and therefore operate at a slower speed.

The circuit operates in the same way as the digital circuit shown in Embodiment Mode does and therefore the explanation is omitted here. Output pulses from the buffers 208 are inputted to the sampling switches 210 to turn the sampling switches 210 conductive. As the sampling switches are turned conductive, analog video signals inputted through the input terminals 25 to 27 are sampled and then written in a pixel 211 and other pixels on the same row where a gate signal line is selected.

Embodiment 2

This embodiment describes a case of controlling ON/OFF of constant current sources using a method different from the one in Embodiment Mode.

Figure 5:
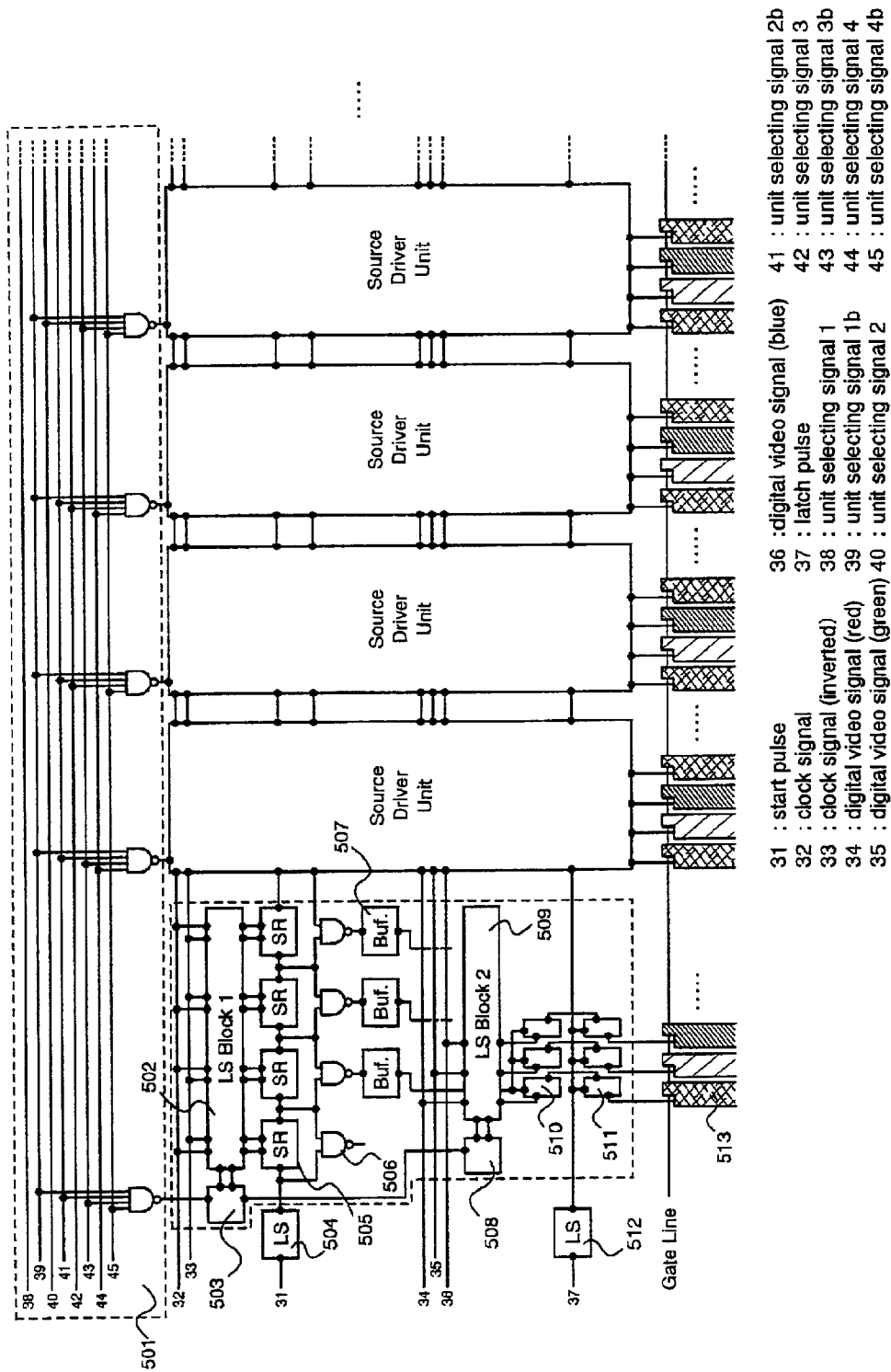
FIG. 5 is diagram showing an example of constructing a selecting circuit from a decoder.
Figure 6:
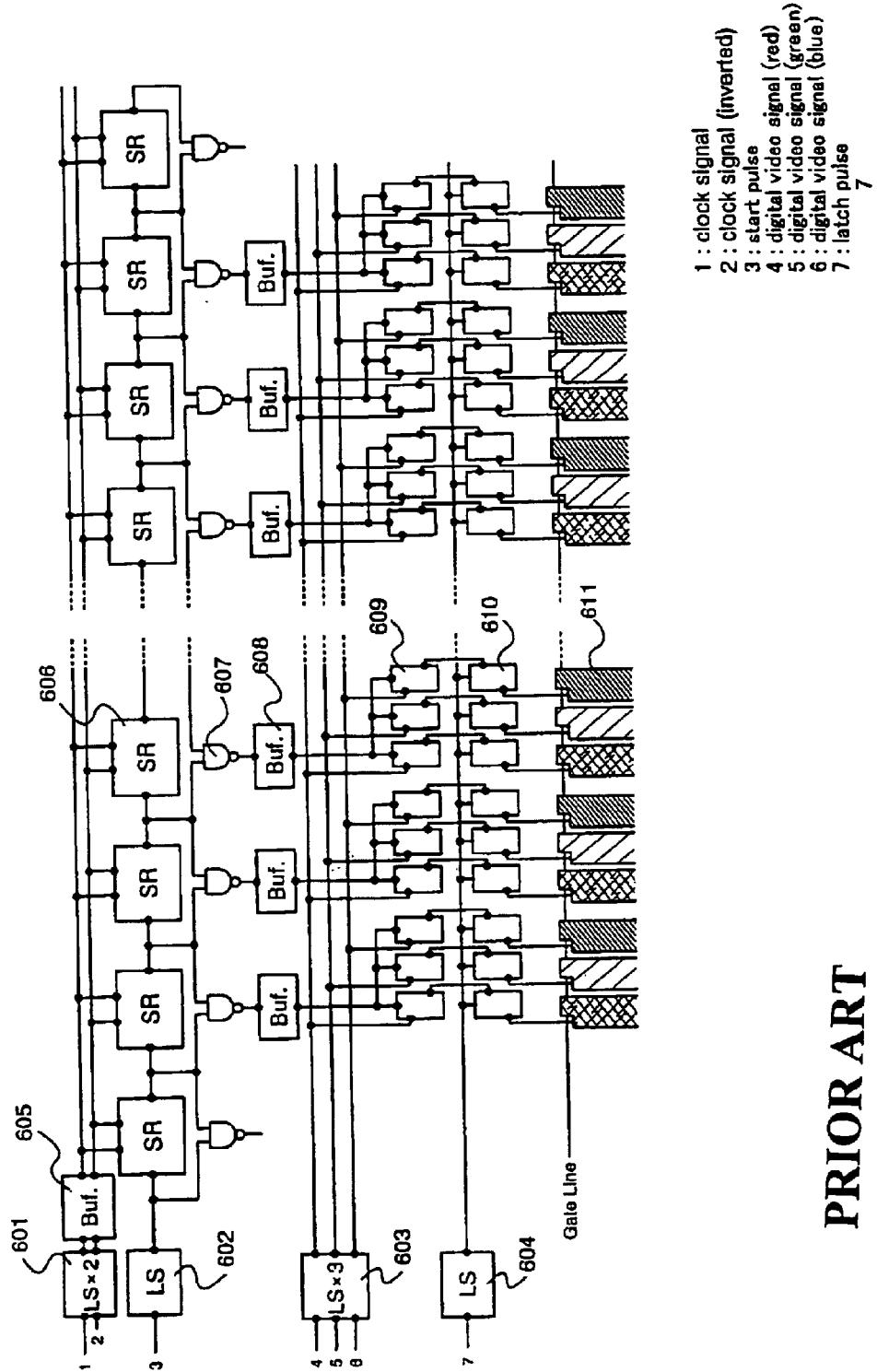
FIG. 6 is a diagram showing the structure of a source signal line driving circuit in a conventional display device.
Figure 7:
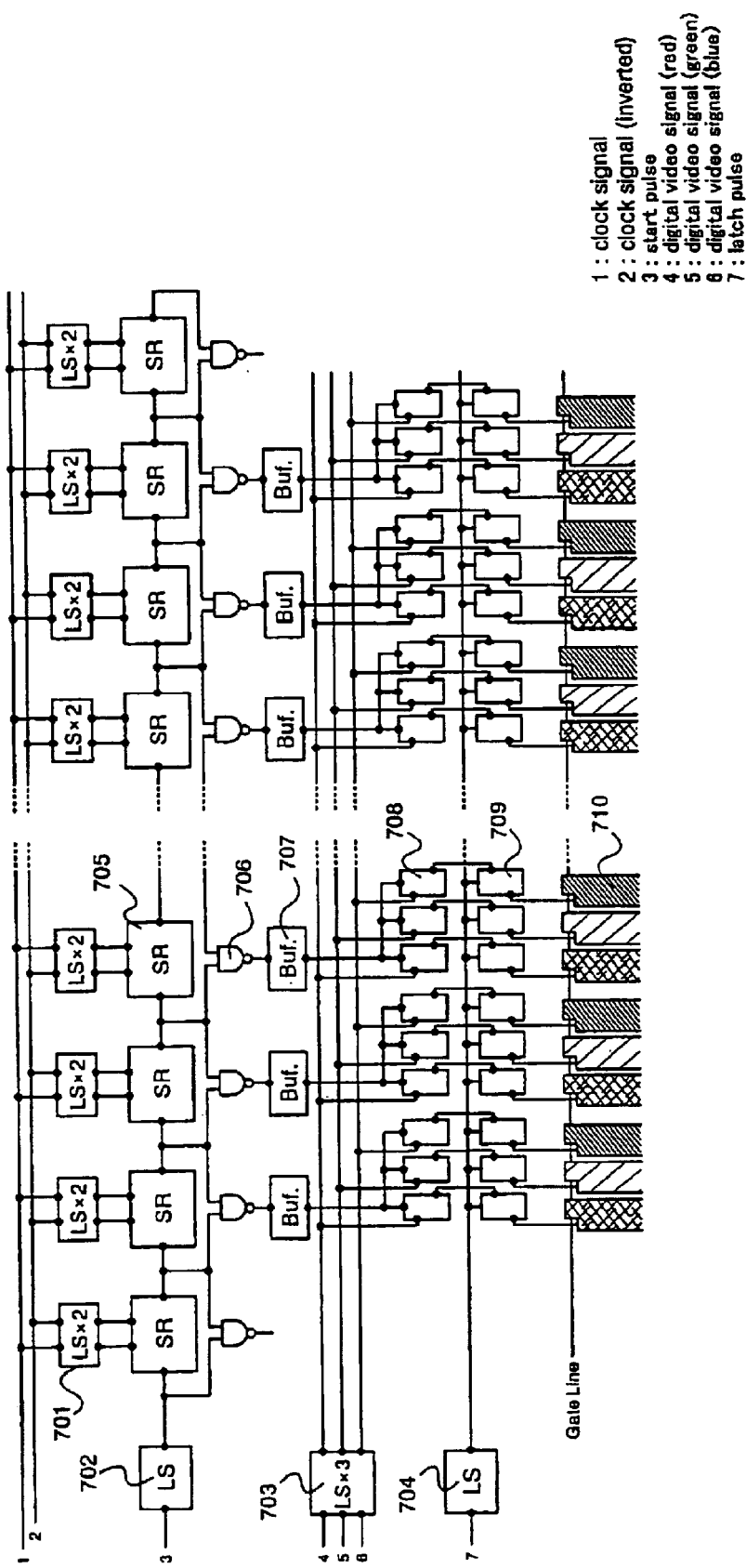
FIG. 7 is a diagram showing the structure of a source signal line driving circuit in a conventional display device.

The driving circuit shown in FIG. 5 operates in the same way as the digital driving circuit of Embodiment Mode does. However, the driving circuit of FIG. 5 uses a decoder 501 to control ON/OFF of constant current sources 503 and 508 instead of shift registers as in Embodiment Mode and Embodiment 1. A unit selecting signal is inputted to input terminals 38 to 45 to determine which constant current source is to be operated. A 4 bit decoder is used in FIG. 5 as an example but what kind of decoder is to be used is determined by the number of stages of units that constitute the source signal line driving circuit.

The method shown in this embodiment may of course be applied to an analog driving circuit.

Embodiment 3

This embodiment gives a description about turning constant current sources ON/OFF over periods involving two units.

Figure 14:
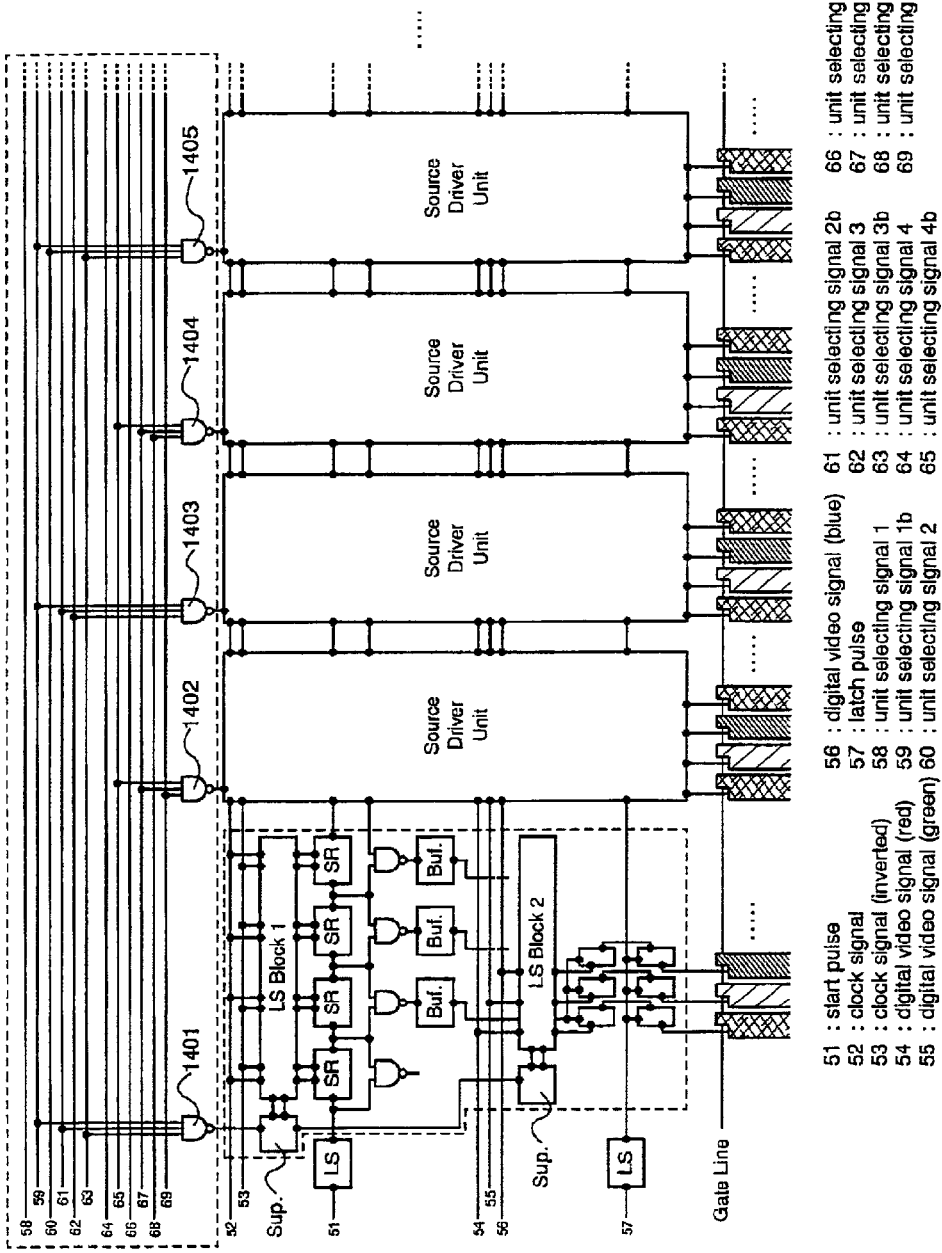
FIG. 14 is a diagram showing an example of constructing a selecting circuit from a decoder.

FIG. 14 shows an example of a driving circuit that uses a decoder to control ON/OFF of constant current sources as in Embodiment 2. In the structure shown in FIG. 5, due to how the decoder is structured, it is basically impossible to output two different pulses simultaneously, in other words, to intentionally set a period where pulses overlap. Accordingly, no margin can be set for delay in operation of the driving circuit by overlapping ON periods of constant current sources of adjacent units. To be specific, a NAND circuit 1402 cannot output a pulse for controlling ON/OFF of the constant current source in the second stage unit while a NAND circuit 1401 is outputting a pulse for controlling ON/OFF of the constant current source in the first stage unit.

Then, this is solved by giving the decoder two phases as shown in FIG. 14 so that ON/OFF of constant current sources in units of odd stages is controlled by pulses outputted from one decoder whereas ON/OFF of constant current sources in units of even stages is controlled by pulses outputted from the other decoder.

First, the NAND circuit 1401 outputs pulses to start (ON) current supply from the constant current source in the first stage unit to the level shifters. After the circuit at the last stage finishes latch operation in the first stage unit, the NAND circuit 1401 stops outputting pulses to end (OFF) the current supply from the constant current source. Immediately before the constant current source in the first stage unit is turned OFF, the NAND circuit 1402 starts outputting pulses to turn the constant current source in the second stage unit ON. This operation can readily be carried out since a terminal for inputting a unit selecting signal to the NAND circuit 1401 is independent of a terminal for inputting a unit selecting signal to the NAND circuit 1402. Subsequently, two phases of decoders control ON/OFF of the constant current sources in odd stage units and ON/OFF of the constant current sources in even stage units alternately. One of merits of this method is high degree of freedom in setting ON periods of constant current sources in adjacent units.

Embodiment 4

This embodiment gives a description about turning constant current sources ON/OFF over periods involving two units by a method different from the one in Embodiment 3.

In carrying out the present invention, if considering reducing power consumption of level shifters alone, less stages of level shifters are supplied with a current during a given period when less stages of shift registers are provided per unit, in other words, when the driving circuit is divided into more units. In this case, the bit number of signals inputted to the decoder in the sub-scanning circuit is increased as well as the number of unit selecting signal lines, thereby increasing the area the sub-scanning circuit occupies. The sub-scanning circuit takes up even larger space when employing the method of Embodiment 4 in which the decoder has two phases.

Accordingly, this embodiment attains the same effect as Embodiment 4 by additionally using output pulses from the shift registers to control ON/OFF of the constant current sources.

Figure 15:
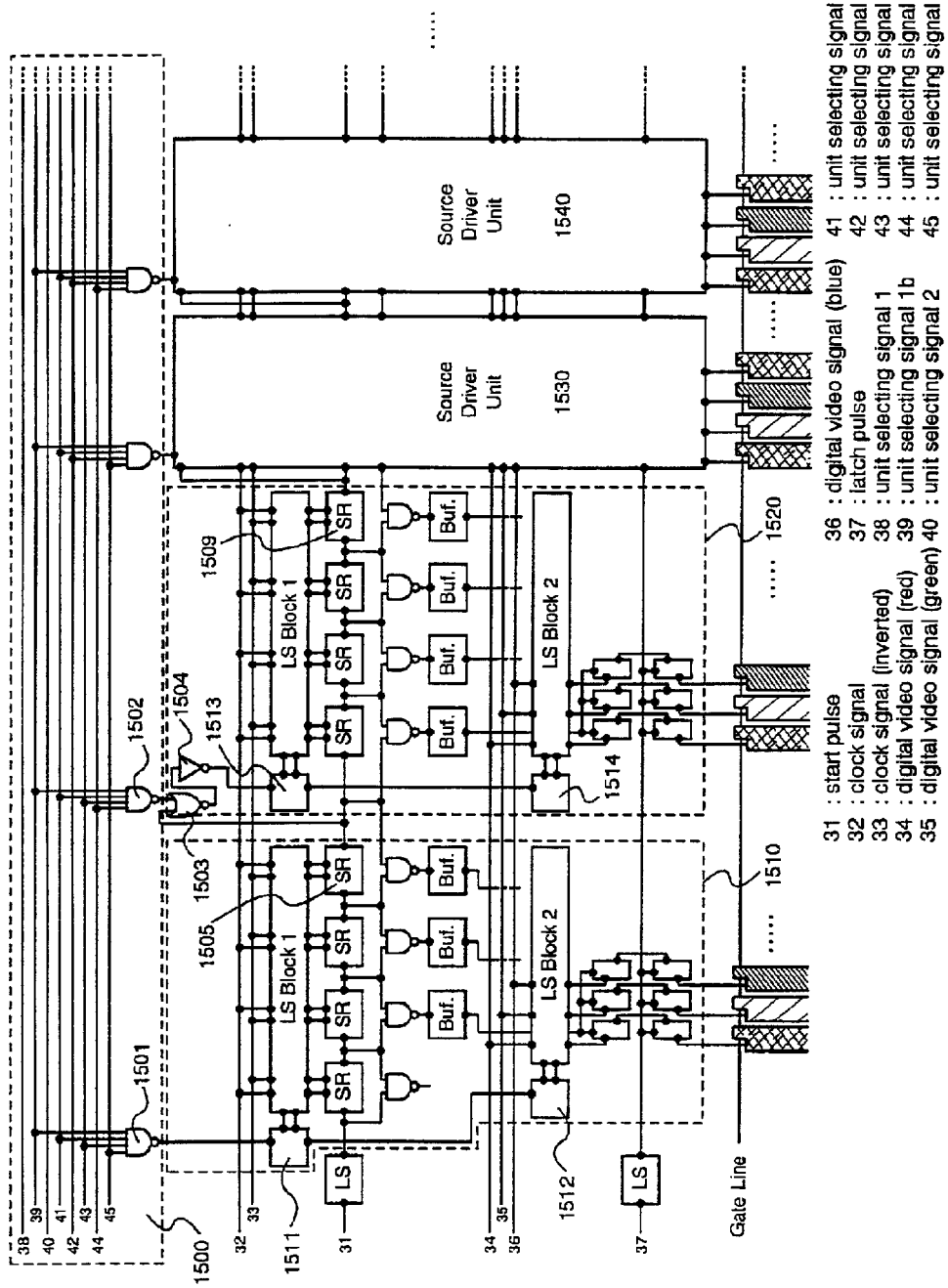
FIG. 15 is a diagram showing an example of constructing a selecting circuit from a decoder.

Reference is made to FIG. 15. A selecting circuit 1500 is similar to the one in Embodiment 2 and is composed of a single phase decoder. Similar to Embodiment 2, a NAND circuit 1501 at the first stage in the decoder outputs pulses to control ON/OFF of a constant current source in a first stage unit 1510. In the second to the last stage units, output pulses from NAND circuits are inputted to newly added circuits. In the second stage unit, output pulses from a NAND circuit 1502 at the second stage in the decoder are inputted to one of input terminals of a 2 input NOR circuit (hereinafter abbreviated as NOR circuit) 1503. To the other input terminal of the NOR circuit 1503, output pulses from a shift register 1505 at the last stage in the unit of the previous stage are inputted. The same applies to all units up through the last stage unit.

In order to distinguish the circuit of this embodiment from the one shown in Embodiment 2, a circuit composed of the NOR circuit 1503 and an inverter 1504 is defined as a constant current source switch circuit. This constant current source switch circuit is included in a unit, and each unit has its own constant current source switch circuit. The constant current source switch circuit shown in this embodiment is merely an example. As long as the input and output logic is the same, the switch circuit can have any structure.

In FIG. 15, the first stage unit does not have a constant current source switch circuit. This is because only the first stage unit can freely determine at which point a selecting signal starts to be inputted to the decoder and does not need to use pulses outputted from other circuits in deciding when to turn the constant current source ON. However, the first stage unit may have a constant current source switch circuit.

Figure 16:
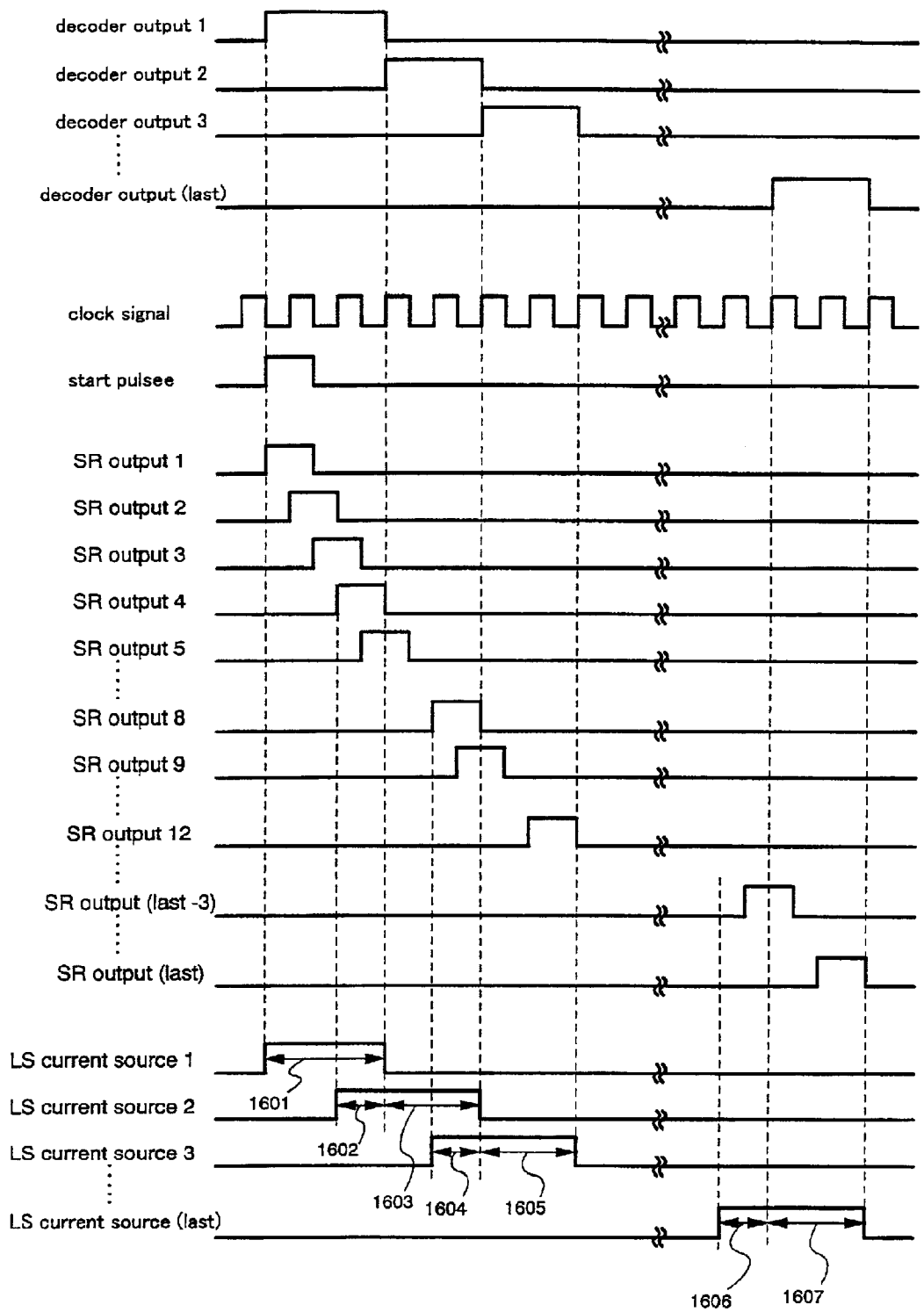
FIG. 16 is a timing chart of the operation of the circuit shown in FIG. 15.

The operation of the circuit will be described referring also to the timing chart of FIG. 16. First, in order to perform level conversion on a clock signal to be inputted to shift registers, a unit selecting signal is inputted to the decoder 1500 and the NAND circuit 1501 outputs pulses ('Decoder Output 1' in FIG. 16) to start current supply from constant current sources 1511 and 1512. In response to the clock signal and the start pulse, shift registers in the first stage unit start to operate and sequentially output pulses ('SR Output #' in FIG. 16. # represents a stage number of from 1 to the last stage number). The pulses denoted as Decoder Output 1 are continuously outputted until the shift register at the last stage in the first stage unit stops operating. This ensures operation of the shift registers in the first stage unit.

Then the second stage unit starts to operate. Here, constant current sources 1513 and 1514 start supplying a current earlier than Decoder Output 2, for output pulses from a shift register 1505 at the last stage in the first stage unit are inputted to the NOR circuit 1503. In FIG. 16 showing the operation timing of constant current sources in the respective units ('LS Current Source #' in FIG. 16. # represents a stage number of from 1 to the last stage number.), outputs from the shift registers in the unit of the previous stage are used to turn the constant current sources ON during a part of a period 1602 instead of outputs from the decoder. After the shift registers in the unit of the previous stage finish outputting, the constant current sources are kept turned ON by outputs from the decoder (a period 1603). In other words, the constant current sources 1513 and 1514 are turned ON while pulses are inputted to both or one of the input terminals of the NOR circuit 1503.

When pulses outputted from a shift register 1509 at the last stage in the second stage unit are inputted to the NOR circuit, constant current sources in the third stage unit are turned ON. Then the constant current sources in the third stage unit are turned OFF as the shift register 1509 stops outputting pulses.

The same operation is sequentially conducted in all units up through the last stage unit of the driving circuit. Thus it is possible to provide a period where constant current sources in two adjacent units are turned ON. Furthermore, the circuit in this embodiment is obtained by adding only a few elements to the circuit of Embodiment 2 and the circuit area in this embodiment is far smaller than the space the circuit will take when the decoder has two phases.

Embodiment 5

In this embodiment, a method of simultaneously forming of TFTs (source signal side driver circuit and gate signal side driver circuit) of a driver circuit is described. However, to simplify of the explanation, concerning the driver circuit portion, CMOS circuit, which is a basic circuit, is illustrated.

FIG. 8A is referred. First, in this embodiment, a substrate 5001 is used, which is made of glass such as barium borosilicate glass or aluminum borosilicate, represented by such as Corning #7059 glass and #1737 glass. Note that, as the substrate 5001, there is no limitation provided that it is a substrate with transmittance, and a quartz substrate may be used. A plastic substrate with heat resistance to a process temperature of this embodiment may also be used.

Then, a base film 5002 formed of an insulating film such as a silicon oxide film, a silicon nitride film or a silicon nitride oxide film is formed on the substrate 5001. In this embodiment, a two-layer structure is used as the base film 5002. However, a single layer film or a lamination structure consisting of two or more layers of the above-mentioned insulating film may be used. As a first layer of the base film 5002, a silicon nitride oxide film 5002a is formed with a thickness of 10 to 200 nm (preferably 50 to 100 nm) with a plasma CVD method using $SiH_4$, $NH_3$, and $N_2O$ as reaction gas. In this embodiment, the silicon nitride oxide film 5002a (composition ratio Si=32%, O=27%, N=24% and H=17%) with a film thickness of 50 nm is formed. Then, as a second layer of the base film 5002, a silicon nitride oxide film 5002b is formed and laminated into a thickness of 50 to 200 nm (preferably 100 to 150 nm) with a plasma CVD method using $SiH_4$ and $N_2O$ as reaction gas. In this embodiment, the silicon nitride oxide film 5002b (composition ratio Si=32%, O=59%, N=7% and H=2%) with a film thickness of 100 nm is formed.

Subsequently, semiconductor layers 5003 to 5006 are formed on the base film. The semiconductor layers 5003 to 5006 are formed from a semiconductor film with an amorphous structure which is formed by a known method (such as a sputtering method, an LPCVD method, or a plasma CVD method), and is subjected to a known crystallization process (a laser crystallization method, a thermal crystallization method, or a thermal crystallization method using a catalyst such as nickel). The crystalline semiconductor film thus obtained is patterned into desired shapes to obtain the semiconductor layers. The semiconductor layers 5003 to 5006 are formed into the thickness of from 25 to 80 nm (preferably 30 to 60 nm). The material of the crystalline semiconductor film is not particularly limited, but it is preferable to be formed of silicon, a silicon germanium ($Si_xGe_{1-x}$(X=0.0001 to 0.02)) alloy, or the like. In this embodiment, 55 nm thick amorphous silicon film is formed by a plasma CVD method, and then, a nickel-containing solution is held on the amorphous silicon film. A dehydrogenation process of the amorphous silicon film is performed (500° C. for one hour), and thereafter a thermal crystallization process is performed (550° C. for four hours) thereto. Further, to improve the crystallinity thereof, a laser annealing treatment is performed to form the crystalline silicon film. Then, this crystalline silicon film is subjected to a patterning process using a photolithography method, to obtain the semiconductor layers 5003 to 5006.

Further, after the formation of the semiconductor layers 5003 to 5006, a minute amount of impurity element (boron or phosphorus) may be doped to control a threshold value of the TFT.

Besides, in the case where the crystalline semiconductor film is manufactured by the laser crystallization method, a pulse-oscillation type or continuous-wave type excimer laser, YAG laser, or $YVO_4$ laser may be used. In the case where those kinds of laser are used, it is appropriate to use a method in which laser light radiated from a laser oscillator is condensed by an optical system into a linear beam, and is irradiated to the semiconductor film. Although the conditions of the crystallization should be properly selected by an operator, in the case where the excimer laser is used, a pulse oscillation frequency is set as 30 Hz, and a laser energy density is set as 100 to 400 $mJ/cm^2$ (typically 200 to 300 $mJ/cm^2$). In the case where the YAG laser is used, it is appropriate that the second harmonic is used to with a pulse oscillation frequency of 1 to 10 kHz and a laser energy density of 300 to 600 $mJ/cm^2$ (typically, 350 to 500 $mJ/cm^2$). Then, laser light condensed into a linear shape with a width of 100 to 1000 $\mu$m, for example, 400 $\mu$m is irradiated to the whole surface of the substrate, and an overlapping ratio (overlap ratio) of the linear laser light at this time may be set as 50 to 90%.

A gate insulating film 5007 is then formed for covering the semiconductor layers 5003 to 5006. The gate insulating film 5007 is formed of an insulating film containing silicon by a plasma CVD method or a sputtering method into a film thickness of from 40 to 150 nm. In this embodiment, the gate insulating film 5007 is formed of a silicon nitride oxide film into a thickness of 110 nm by a plasma CVD method (composition ratio Si=32%, O=59%, N=7%, and H=2%). Of course, the gate insulating film 5007 is not limited to the silicon nitride oxide film, and an other insulating film containing silicon may be used as a single layer or a lamination structure.

Besides, when the silicon oxide film is used, it can be possible to be formed by a plasma CVD method in which TEOS (tetraethyl orthosilicate) and $O_2$ are mixed and discharged at a high frequency (13.56 MHZ) power density of 0.5 to 0.8 $W/cm^2$ with a reaction pressure of 40 Pa and a substrate temperature of 300 to 400° C. Good characteristics as the gate insulating film can be obtained in the manufactured silicon oxide film thus by subsequent thermal annealing at 400 to 500° C.

Then, on the gate insulating film 5007, a first conductive film 5008 with a thickness of 20 to 100 nm and a second conductive film 5009 with a thickness of 100 to 400 nm are formed and laminated. In this embodiment, the first conductive film 5007 of TaN film with a film thickness of 30 nm and the second conductive film 5008 of a W film with a film thickness of 370 nm are formed into lamination. The TaN film is formed by sputtering with a Ta target under a nitrogen containing atmosphere. Besides, the W film is formed by the sputtering method with a W target. The W film may be formed by a thermal CVD method using tungsten hexafluoride ($WF_6$). Whichever method is used, it is necessary to make the material have low resistance for use as the gate electrode, and it is preferred that the resistivity of the W film is set to less than or equal to 20 $\mu\Omega$cm. By making the crystal grains large, it is possible to make the W film have lower resistivity. However, in the case where many impurity elements such as oxygen are contained within the W film, crystallization is inhibited and the resistance becomes higher. Therefore, in this embodiment, by forming the W film by a sputtering method using a target with a purity of 99.9999%, and in addition, by taking sufficient consideration to prevent impurities within the gas phase from mixing therein during the film formation, a resistivity of from 9 to 20 $\mu\Omega$cm can be realized.

Note that, in this embodiment, the first conductive film 5008 is made of TaN, and the second conductive film 5009 is made of W, but the material is not particularly limited thereto, and either film may be formed of an element selected from the group consisting of Ta, W, Ti, Mo, Al, Cu, Cr, and Nd, or an alloy material or a compound material containing the above element as its main constituent. Besides, a semiconductor film, typified by a polycrystalline silicon film doped with an impurity element such as phosphorus, may be used. Further, an AgPdCu alloy may be used. Besides, any combination may be employed such as a combination in which the first conductive film is formed of tantalum (Ta) and the second conductive film is formed of W, a combination in which the first conductive film is formed of titanium nitride (TiN) and the second conductive film is formed of W, a combination in which the first conductive film is formed of tantalum nitride (TaN) and the second conductive film is formed of Al, or a combination in which the first conductive film is formed of tantalum nitride (TaN) and the second conductive film is formed of Cu.

Next, as shown in FIG. 8B, mask 5010 made of resist are formed using a photolithography method, and a first etching process is performed in order to form electrodes and wirings. This first etching process is performed with the first and second etching conditions. In this embodiment, as the first etching conditions, an ICP (inductively coupled plasma) etching method is used, a gas mixture of $CF_4$, $Cl_2$ and $O_2$ is used as an etching gas, the gas flow rate is set to 25/25/10 sccm, and plasma is generated by applying a 500 W RF (13.56 MHZ) power to a coil shape electrode under 1 Pa. A dry etching device with ICP (Model E645-ICP) produced by Matsushita Electric Industrial Co. Ltd. is used here. A 150 W RF (13.56 MHZ) power is also applied to the substrate side (test piece stage) to effectively apply a negative self-bias voltage. The W film is etched with the first etching conditions, and the end portion of the second conductive layer is formed into a tapered shape. In the first etching conditions, the etching rate for W is 200.39 nm/min, the etching rate for TaN is 80.32 nm/min, and the selectivity of W to TaN is about 2.5. Further, the taper angle of W is about 26° with the first etching conditions.

Thereafter, as shown in FIG. 8B, the first etching conditions are changed into the second etching conditions without removing the mask 5010 made of resist, a mixed gas of $CF_4$ and $Cl_2$ is used as an etching gas, the gas flow rate is set to 30/30 sccm, and plasma is generated by applying a 500 W RF (13.56 MHZ) power to a coil shape electrode under 1 Pa to thereby perform etching for about 30 seconds. A 20 W RF (13.56 MHZ) power is also applied to the substrate side (test piece stage) to effectively a negative self-bias voltage. The W film and the TaN film are both etched on the same order with the second etching conditions in which $CF_4$ and $Cl_2$ are mixed. In the second etching conditions, the etching rate for W is 58.97 nm/min, and the etching rate for TaN is 66.43 nm/min. Note that, the etching time may be increased by approximately 10 to 20% in order to perform etching without any residue on the gate insulating film.

In the first etching process, the end portions of the first and second conductive layers are formed to have a tapered shape due to the effect of the bias voltage applied to the substrate side by adopting masks of resist with a suitable shape. The angle of the tapered portions may be set to 15° to 45°. Thus, first shape conductive layers 5011 to 5015 (first conductive layers 5011a to 5015a and second conductive layers 5011b to 5015b) constituted of the first conductive layers and the second conductive layers are formed by the first etching process. Reference numeral 5007 denotes a gate insulating film, and regions of the gate insulating film which are not covered by the first shape conductive layers 5011 to 5015 are made thinner by approximately 20 to 50 nm by etching.

Then, a first doping process is performed to add an impurity element for imparting an n-type conductivity to the semiconductor layer without removing the mask made of resist (FIG. 8B). Doping may be carried out by an ion doping method or an ion injecting method. The condition of the ion doping method is that a dosage is $1 \times 10^{13}$ to $5 \times 10^{15}$ atoms/$cm^2$, and an acceleration voltage is 60 to 100 keV. In this embodiment, the dosage is $1.5 \times 10^{15}$ atoms/$cm^2$ and the acceleration voltage is 80 keV. As the impurity element for imparting the n-type conductivity, an element which belongs to group 15 of the periodic table, typically phosphorus (P) or arsenic (As) is used, and phosphorus is used here. In this case, the conductive layers 5011 to 5015 become masks to the impurity element for imparting the n-type conductivity, and high concentration impurity regions 5016 to 5019 are formed in a self-aligning manner. The impurity element for imparting the n-type conductivity is added to the high concentration impurity regions 5016 to 5019 in the concentration range of $1 \times 10^{20}$ to $1 \times 10^{21}$ atoms/$cm^3$.

Thereafter, as shown in FIG. 8C, the second etching process is performed without removing the masks made of resist. Here, a mixed gas of $CF_4$, $Cl_2$ and $O_2$ is used as an etching gas, the gas flow rate is set to 20/20/20 sccm, and plasma is generated by applying a 500 W RF (13.56 MHZ) power to a coil shape electrode under 1 Pa to thereby perform etching. A 20 W RF (13.56 MHZ) power is also applied to the substrate side (test piece stage) to effectively apply a negative self-bias voltage. In the second etching process, the etching rate for W is 124.62 nm/min, the etching rate for TaN is 20.67 nm/min, and the selectivity of W to TaN is 6.05. Accordingly, the W film is selectively etched. The taper angle of W is 70° in the second etching. Second conductive layers 5020b to 5024b are formed by the second etching process. On the other hand, the first conductive layers 5011a to 5015a are hardly etched, and first conductive layers 5020a to 5024a are formed.

Next, a second doping process is performed. Second conductive layers 5020b to 5024b are used as masks to an impurity element, and doping is performed such that the impurity element is added to the semiconductor layer below the tapered portions of the first conductive layers. In this embodiment, phosphorus (P) is used as the impurity element, and plasma doping is performed with the dosage of $1.5 \times 10^{14}$ atoms/$cm^2$, the current density 0.5 $\mu$A and the acceleration voltage of 90 keV. Thus, low concentration impurity regions 5025 to 5028, which overlap with the first conductive layers, are formed in a self-aligning manner. The concentration of phosphorus (P) in the low concentration impurity regions 5025 to 5028 is $1 \times 10^{17}$ to $5 \times 10^{18}$ atoms/$cm^3$, and has a gentle concentration gradient in accordance with the film thickness of the tapered portions of the first conductive layers. Note that, in the semiconductor layer that overlaps with the tapered portions of the first conductive layers, the concentration of the impurity element slightly falls from the end portions of the tapered portions of the first conductive layers toward the inner portions. The concentration, however, keeps almost the same level. Further, the impurity element is added to the high concentration impurity regions 5016 to 5019. (FIG. 9A)

Figures 9A, 9B, 9C:
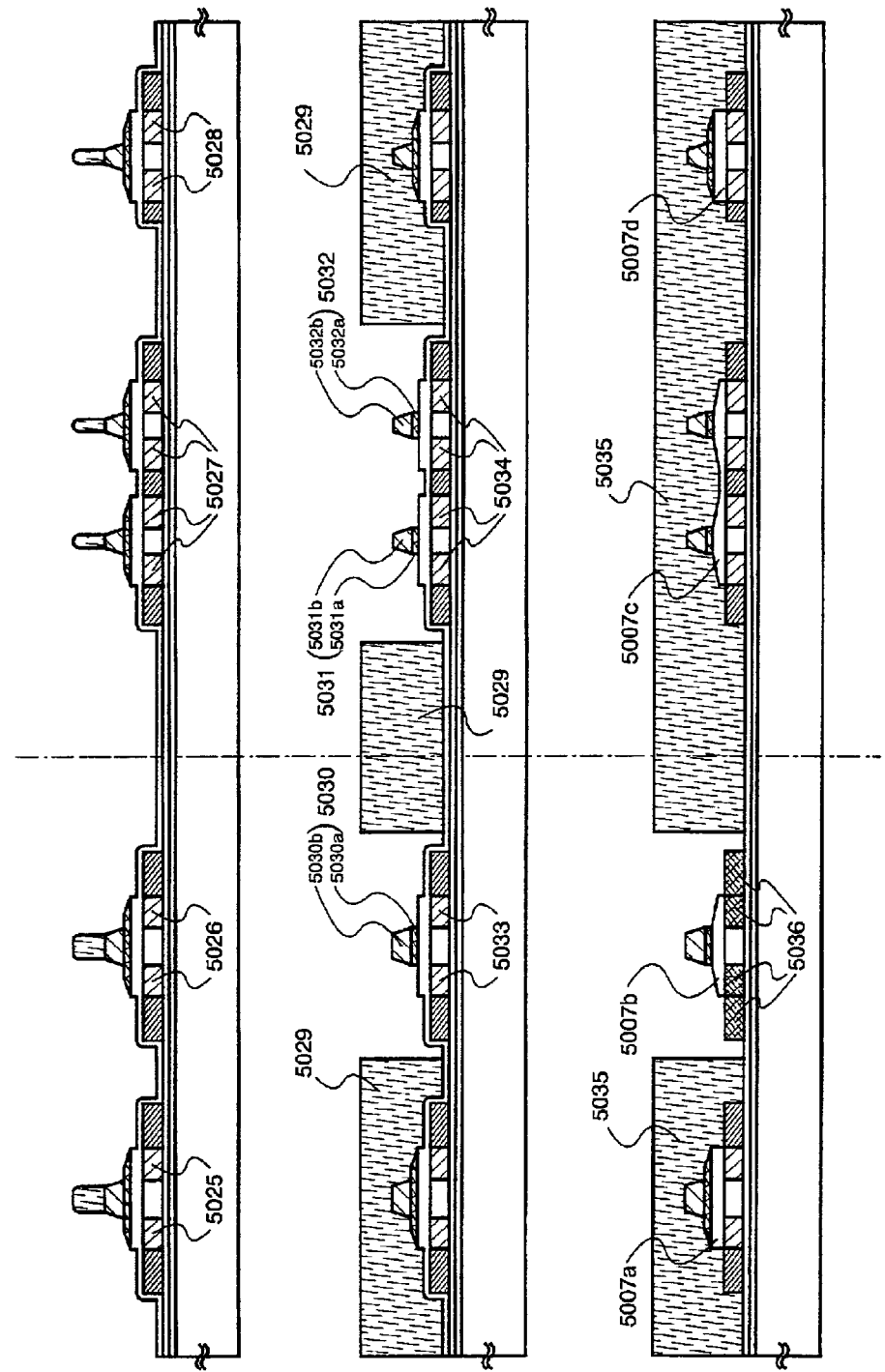
FIGS. 9A to 9C are diagrams showing an example of a process of manufacturing a display device.

Subsequently, as shown in FIG. 9B, after the masks made of resist are removed, a third etching process is conducted using a photolithography method. In this third etching process, the tapered portions of the first conductive layers are partially etched to make the first conductive layers have shapes overlapping the second conductive layers. However, masks made of resist 5029 are formed in the regions to which the third etching process is not conducted.

Etching conditions in the third etching process are such that $Cl_2$ and $SF_6$ are used as etching gases, a gas flow rate is set to 10/50 sccm, and the ICP etching method is used as in the first and second etching processes. Note that, in the third etching process, the etching rate to TaN is 111.2 nm/min and the etching rate to the gate insulating film is 12.8 nm/min.

In this embodiment, etching is performed such that an RF (13.56 MHz) power of 500 W is applied to a coil shape electrode with a pressure of 1.3 Pa to generate plasma. An RF (13.56 MHz) power of 10 W is applied to the substrate side (sample stage), thereby applying substantially a negative self-bias voltage. Thus, first conductive layers 5030a to 5032a are formed.

Through the third etching process, impurity regions (LDD regions) 5033 and 5034 are formed, which do not overlap the first conductive layers 5030a to 5032a. Note that the impurity regions (GOLD regions) 5025 and 5028 remain overlapping the first conductive layers 5020a and 5024a, respectively.

As described above, in this embodiment, the impurity regions (LDD regions) 5033 and 5034 not overlapping the first conductive layers and the impurity regions (GOLD regions) 5025 and 5028 overlapping the first conductive layers can be simultaneously formed. Thus, the impurity regions can be separately formed in accordance with the TFT characteristics.

Subsequently, after the masks made of resist are removed, the gate insulating film 5007 is subjected to an etching process. This etching process is conducted using $CHF_3$ as an etching gas by a reactive ion etching method (RIE method). In this embodiment, the third etching process is conducted with a chamber pressure of 6.7 Pa, RF power of 800 W, and a $CHF_3$ gas flow rate of 35 sccm. Thus, parts of the high concentration impurity regions 5016 to 5019 are exposed, and gate insulating films 5007a to 5007d are formed.

Next, masks 5035 made of resist are newly formed, and a third doping process is conducted. By this third doping process, impurity regions 5036 added with the impurity element imparting the second conductivity type (p-type) opposite to the first conductivity type (n-type) are formed in the semiconductor layer that becomes an active layer of a p-channel TFT (FIG. 9C). The first conductive layer 5030a is used as a mask to the impurity element, and the impurity element imparting p-type conductivity is added to thereby form the impurity regions in a self-aligning manner.

In this embodiment, the impurity regions 5036 are formed by an ion doping method using diborane ($B_2H_6$). Note that the semiconductor layers forming n-channel TFTs are covered by the masks 5035 made of resist in this third doping process. By the first doping process and the second doping process, the impurity regions 5036 are added with phosphorous at different concentrations. However, in any of the regions, the doping process is performed such that the concentration of the impurity element imparting p-type conductivity is $2\times10^{20}$ to $2\times10^{21}$ atoms/cm$^3$. Thus, no problem occurs since the impurity regions function as the source regions and drain regions of the p-channel TFT.

Through the above-described processes, the impurity regions are formed in the respective semiconductor layers. Note that, in this embodiment, a method is shown, in which doping of the impurity element (B) is performed after etching the gate insulating film, but doping of the impurity element may be conducted without etching the gate insulating film.

Figures 10A, 10B, 10C:
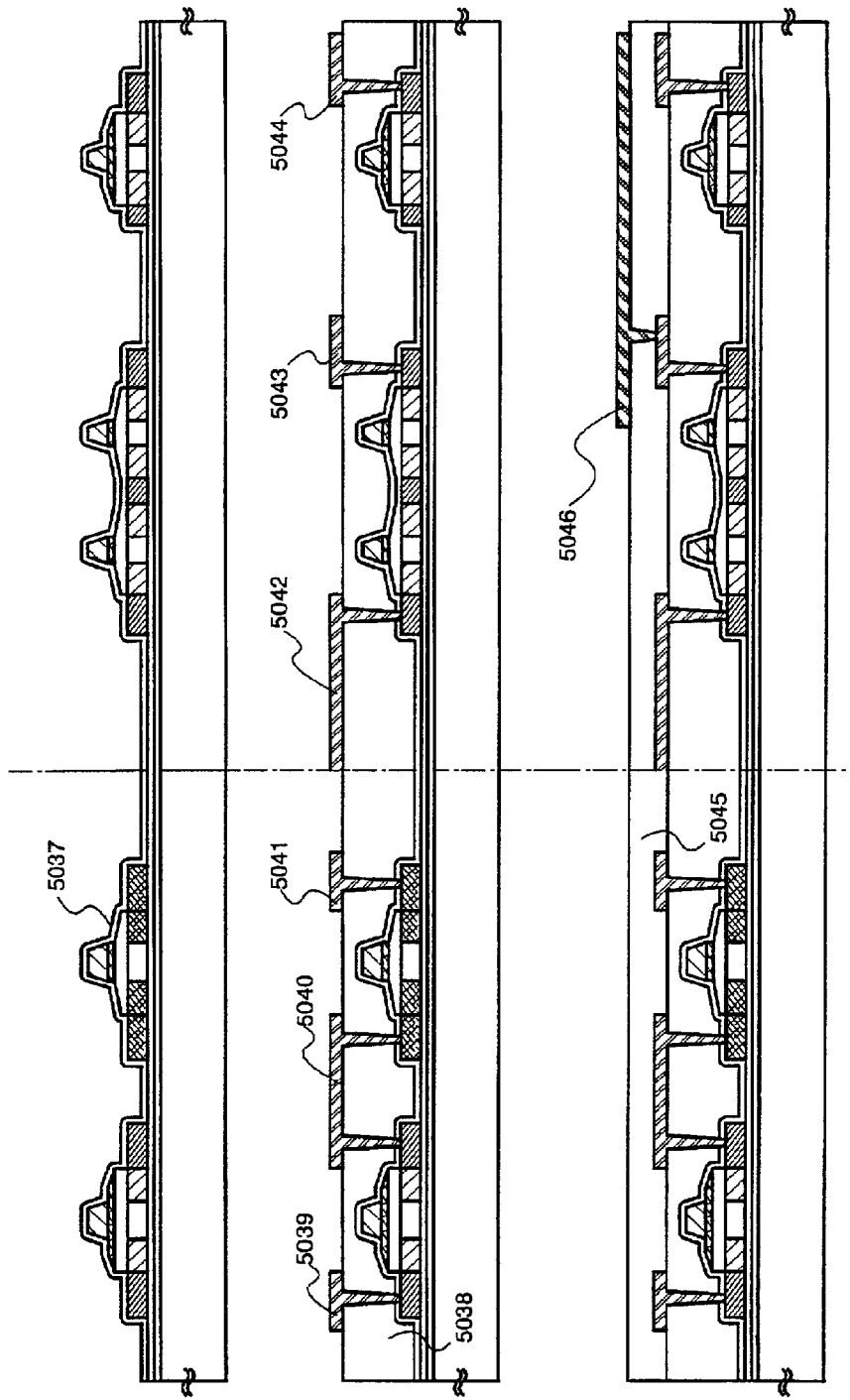
FIGS. 10A to 10C are diagrams showing an example of a process of manufacturing a display device.

Subsequently, the masks 5035 made of resist are removed, and a first interlayer insulating film 5037 is formed as shown in FIG. 10A. As the first interlayer insulating film 5037, an insulating film containing silicon is formed with a thickness of 100 to 200 nm by using a plasma CVD method or a sputtering method. In this embodiment, a silicon oxide nitride film is formed with a thickness of 150 nm by the plasma CVD method. Of course, the first interlayer insulating film 5037 is not limited to the silicon oxide nitride film, and other insulating films containing silicon may also be used in a single layer or a lamination structure.

Then, a process of activating the impurity elements added into the respective semiconductor layers is conducted. This activation process is performed by a thermal annealing method using an annealing furnace. The thermal annealing method may be conducted with an oxygen concentration of 1 ppm or less, preferably 0.1 ppm or less in a nitrogen atmosphere at 400 to 700° C., typically, 500 to 550° C. In this embodiment, the activation process is performed by a heating process at 55020 C. for 4 hours. Note that, in addition to the thermal annealing method, a laser annealing method or a rapid thermal annealing method (RTA method) may be applied.

Note that, in this embodiment, with the activation process, Ni used as a catalyst in the crystallization is gettered to the impurity region containing P at high concentration to reduce the nickel concentration in the semiconductor layer that mainly becomes a channel forming region. The TFT having the channel forming region thus manufactured has the lowered off current value and the good crystallinity. Thus, a high electric field effect mobility can be obtained, thereby being capable of achieving the satisfactory characteristics.

Further, before the formation of the first interlayer insulating film 5037, the activation process may be conducted. However, in the case where the used wiring material is weak to heat, it is preferable that the activation process is performed after the interlayer insulating film 5037 (the insulating film containing silicon as its main constituent, for example, silicon nitride film) is formed to protect the wirings or the like as in this embodiment.

Besides, the doping process may be conducted after the activation process, and then, the first interlayer insulating film 5037 may be formed.

Furthermore, a heating process at 300 to 55020 C. for 1 to 12 hours is conducted in an atmosphere containing hydrogen of 3 to 100%, thereby conducting a step of hydrogenating the semiconductor layers. In this embodiment, a heating process is conducted at 410° C. for 1 hour in a nitrogen atmosphere containing hydrogen of approximately 3%. This is a step of terminating dangling bonds in the semiconductor layer by hydrogen contained in the interlayer insulating film 5037. As another means for hydrogenation, plasma hydrogenation (using hydrogen excited by plasma) may be carried out.

Moreover, in the case where a laser annealing method is used for the activation process, it is desirable that laser light emitted from an excimer laser, a YAG laser or the like is irradiated after the hydrogenation.

Next, as shown in FIG. 10B, a second interlayer insulating film 5038 made from an organic insulating material is formed on the first interlayer insulating film 5037. In this embodiment, an acrylic resin film is formed with a thickness of 1.6 μm. Thereafter, patterning is performed for forming contact holes that reach the respective impurity regions 5016, 5018, 5019, and 5036.

A film formed from an insulating material containing silicon or organic resin is used as the second interlayer insulating film 5038. Silicon oxide, silicon nitride, and silicon oxide nitride may be used for the insulating material containing silicon, and polyimide, polyamide, acryl, BCB (benzocyclobutene) and the like may be used for the organic resin.

In this embodiment, a silicon oxide nitride film is formed by a plasma CVD method. Note that the thickness of the silicon oxide nitride film is preferably 1 to 5 μm (more preferably 2 to 4 μm). The silicon oxide nitride film is effective in suppressing deterioration of the EL element since the amount of moisture contained in the film itself is small.

Further, dry etching or wet etching may be used for the formation of the contact holes. However, taking the problem of electrostatic destruction in etching into consideration, the wet etching method is desirably used.

Furthermore, in the formation of the contact holes here, the first interlayer insulating film 5037 and the second interlayer insulating film 5038 are etched at the same time. Thus, in consideration for the shape of the contact hole, it is preferable that the material with an etching speed faster than that of the material for forming the first interlayer insulating film 5037 is used as the material for forming the second interlayer insulating film 5038.

Then, wirings 5039 to 5044, which are electrically connected with the impurity regions 5016, 5018, 5019, and 5036, respectively, are formed. Here, the wirings are formed by patterning a lamination film of a Ti film of 50 nm thickness and an alloy film (alloy film of Al and Ti) of 500 nm thickness, but other conductive films may also be used.

As described above, the driver circuit having the n-channel TFT and the p-channel TFT, and the pixel portion having the pixel TFT and the holding capacitor can be formed on the same substrate. In this specification, such a substrate is referred to as an active matrix substrate.

Further, as for the holding capacitor, before the formation of the gate conductive films, doping of impurity elements may be performed on necessary portions to form capacitors. One photo resist mask is increased with this method, but the holding capacitor can be formed without applying bias.

Subsequently, a third interlayer insulating film 5045 is formed. This process is performed so as to level the surface on which a TFT is formed for the subsequent formation of a pixel electrode. Thus, it is desirable that the third interlayer insulating film 5045 is formed of an insulating film made of a resin film such as acryl, which has an excellent leveling property. Then, an MgAg film is formed thereon, and a pixel electrode (reflecting electrode) 5046 is formed by patterning the film (FIG. 10C).

Figure 11:
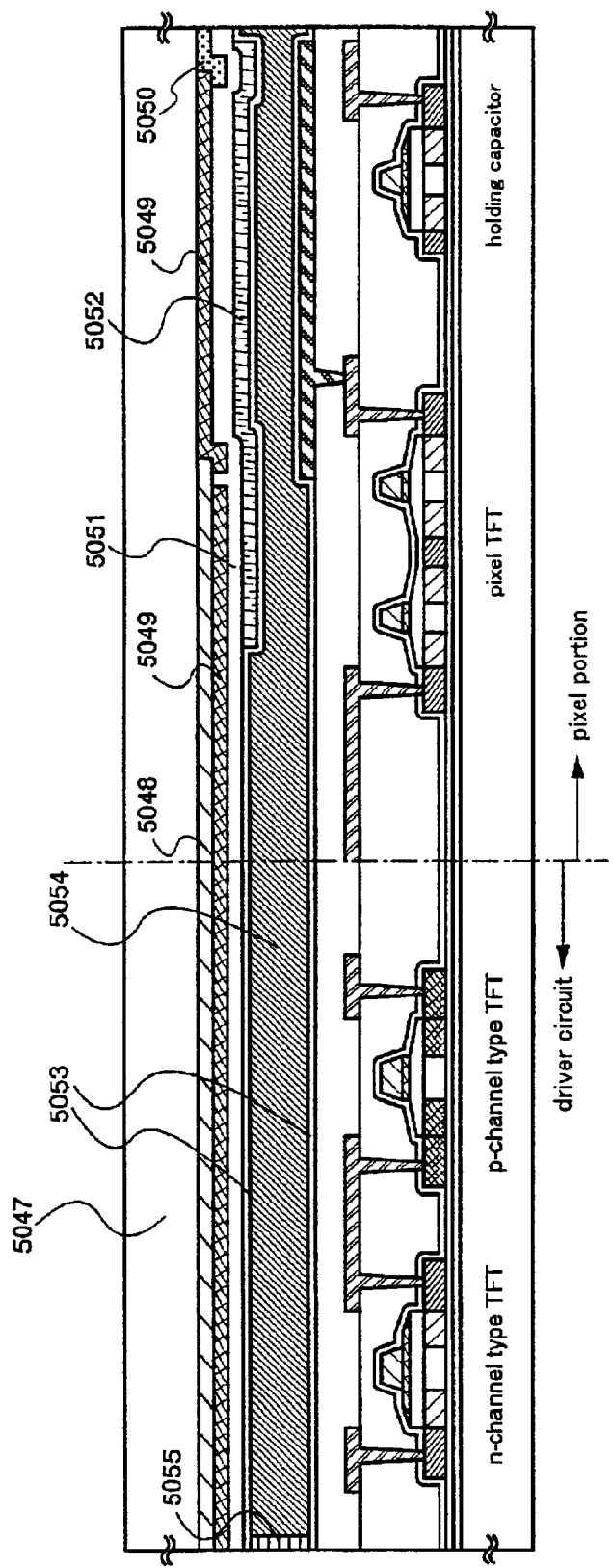
FIG. 11 is a diagram showing an example of a process of manufacturing a display device.

On the other hand, an opposing substrate 5047 is prepared. As shown in FIG. 11A, the opposing substrate 5047 is provided with color filter layers 5048 to 5050, and an overcoat layer 5051. The color filter layers are structured such that the color filter layers 5048 and 5049 of different colors are formed in an overlapping manner above the TFTs, and function also as a light shielding film. Note that the color filter layers of respective colors are formed from resin mixed with pigment with a thickness of 1 to 3 μm. A photosensitive material is used for the color filter layers, and a predetermined pattern can be formed using a mask. Simultaneously, a spacer (not shown) is formed by using the color filter layers. The spacer may be formed by forming the color filters in an overlapping manner. The height of the spacer can be set to 2 to 7 μm, preferably 4 to 6 μm by taking the thickness of the overcoat layer 5051 of 1 to 4 μm into consideration. The height enables the formation of a gap in bonding the active matrix substrate and the opposing substrate. The overcoat layer 5051 is formed from an optically hardened or thermally hardened type organic resin material, and polyimide, acrylic resin or the like may be used.

After the formation of the overcoat layer 5051, an opposing electrode 5052 made of a transparent conductive film is formed by patterning. Thereafter, an orientation film 5053 is formed on both the active matrix substrate and the opposing substrate, and a rubbing process is performed.

Thereafter, the active matrix substrate and the opposing substrate are bonded by a sealant 5055. The sealant 5055 is mixed with a filler, and the two substrates are bonded with a uniform interval by the filler and the spacer. Subsequently, a liquid crystal material 5054 is injected between both substrates to completely encapsulate the liquid crystal material 5054 by an encapsulant (not shown). A known liquid crystal material may be used as the liquid crystal material 5054. As described above, the active matrix liquid crystal display device as shown in FIG. 11A is completed.

Note that the TFT in the active matrix liquid crystal display device manufactured by the above-described processes takes a top gate structure. However, this embodiment can also be applied with ease with respect to a bottom gate structure TFT and TFTs having other structures. Further, the pixel electrode is formed using a transparent conductive film and therefore the active matrix liquid crystal display device can be formed as a transparent type display device.

Further, a glass substrate is used in this embodiment, but there is no limitation on the substrate. This embodiment can be implemented in the case that substrates other than the glass substrate are used, such as a plastic substrate, a stainless substrate, a single crystal wafer or the like.

Embodiment 6

The display device of the present invention has various usages. In this embodiment, the application example of electronic devices incorporating the display device of the present invention is explained.

The following can be given as examples of such electronic devices: a portable information terminal (such as an electronic book, a mobile computer, a mobile telephone); a video camera; a digital camera; a personal computer; a television and a projector device and like that. Examples of these electronic devices are shown in FIGS. 12A to 13C.

Figure 12A:
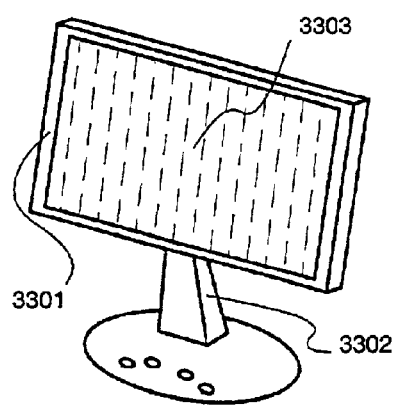
FIGS. 12A to 12D are diagrams showing examples of applying a display device of the present invention to electronic equipment.

FIG. 12A is a liquid crystal display (LCD), containing a casing 3301, a support stand 3302, and a display portion 3303. The display device of the present invention can be used in the display portion 3303.

Figure 12B:
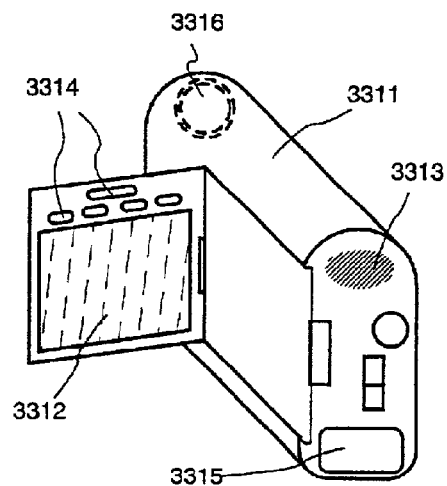

FIG. 12B is a video camera, containing a main body 3311, a display portion 3312, an audio input portion 3313, operation switches 3314, a battery 3315, and an image receiving portion 3316. The display device of the present invention can be used in the display portion 3312.

Figure 12C:
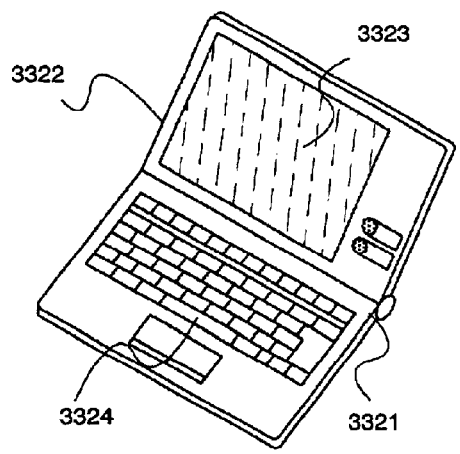

FIG. 12C is a personal computer, containing a main body 3321, a casing 3322, a display portion 3323, and a keyboard 3324. The display device of the present invention can be used in the display portion 3323.

Figure 12D:
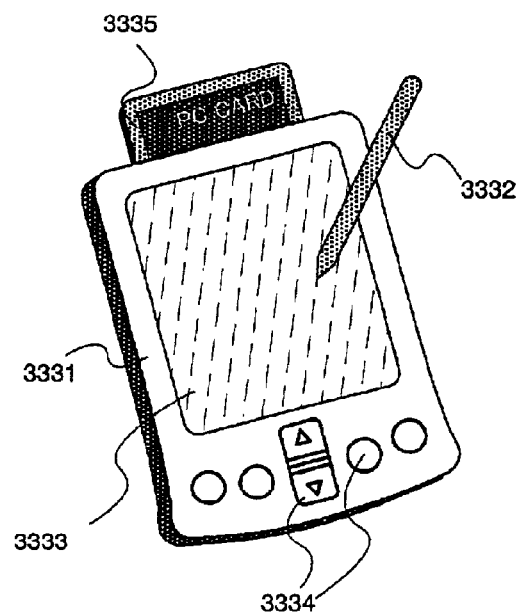

FIG. 12D is a portable information terminal, containing a main body 3331, a stylus 3332, a display portion 3333, an operation button 3334, and an external interface 3335. The display device of the present invention can be used in the display portion 3333.

FIG. 13A is a portable telephone, containing a main body 3401, an audio output portion 3402, an audio input portion 3403, a display portion 3404, operation switches 3405, and an antenna 3406. The display device of the present invention can be used in the display portion 3404.

FIG. 13B is an audio reproducing device, specifically a car audio system, containing a main body 3411, a display portion 3412, and operation switches 3413 and 3414. The display device of the present invention can be used in the display portion 3412. Furthermore, an audio reproducing device for a car is shown in Embodiment 6, but it may also be used for a mobile type and a domestic type of audio reproducing device.

FIG. 13C is a digital camera, containing a main body 3501, a display device (A) 3502, a view finder 3503, an operation switches 3504, a display portion (B) 3505 and a battery 3506. The device of the present invention can be used in the display device (A) 3502 and a display portion (B) 3505.

The range of applications of the present invention is thus extremely wide, and it is possible to apply the present invention to electronic devices in all fields. Furthermore, any constitution of the liquid crystal display device shown in Embodiments 1 to 5 may be employed in the electronic devices of Embodiment 6.

The present invention can provide a driving circuit for a display device which can deal with lowered drive voltage of an external controller LSI or the like and can reduce power consumption.

What is claimed is:

1. A display device having a driving circuit and a pixel portion,
    wherein the driving circuit has a first scanning circuit and a second scanning circuit,
    wherein the first scanning circuit has a shift register, a level shifter, and a constant current source, the shift register sequentially outputting first pulses in response to a first clock signal, the level shifter converting the voltage amplitude of a signal inputted, the constant current source supplying a current to the level shifter,
    wherein the second scanning circuit has a shift register for sequentially outputting second pulses in response to a second clock signal, and
    wherein the constant current source is operated only while he second pulses sequentially outputted from the second scanning circuit are inputted to the constant current source in the stage unit,
    wherein the constant current source supplies a current to the level shifter while the constant current source is operated.

2. A display device according to claim 1, wherein the frequency of the second clock signal is lower than the frequency of the first clock signal.

3. A display device according to claim 1, wherein the second clock signal is generated from the first clock signal by an internal frequency divider circuit.

4. A display device according to claim 1, wherein a substrate selected from the group consisting of a glass substrate, a plastic substrate, a stainless steel substrate, an a single crystal wafer is provided.

5. A display device according to claim 1, wherein the driving circuit and the pixel portion are formed on the same substrate integrally.

6. A display device according to claim 1, wherein the driving circuit and the pixel portion are formed on different substrates.

7. A display device according to claim 1, wherein the display device is selected from the group consisting of: a liquid crystal display, a personal computer, a portable information terminal, a car audio system and digital camera.

8. A display device having a driving circuit and a pixel portion,
    wherein the driving circuit has a first scanning circuit and a second scanning circuit,
    wherein the first scanning circuit has first to x-th stages of units (x stages in total, x is a natural number and satisfies $x \geq 2$),
    wherein the x stages of units each have a shift register, a level shifter, and a constant current source, the shift register sequentially outputting first pulses in response to a first clock signal, the level shifter converting the voltage amplitude of a signal inputted, the constant current source supplying a current to the level shifter,
    wherein the second scanning circuit has a shift register for sequentially outputting second pulses in response to a second clock signal, and
    wherein the constant current source in the a-th stage unit (a is a natural number and satisfies $1 \leq a \leq x$) is operated only while the second pulses sequentially outputted from the second scanning circuit are inputted to the constant current source in the a-th stage unit,
    wherein the constant current source supplies a current to the level shifter while the constant current source is operated.

9. A display device according to claim 8, wherein the frequency of the second clock signal is lower than the frequency of the first clock signal.

10. A display device according to claim 8, wherein the second clock signal is generated from the first clock signal by an internal frequency divider circuit.

11. A display device according to claim 8, wherein a substrate selected from the group consisting of a glass substrate, a plastic substrate, a stainless steel substrate, an a single crystal wafer is provided.

12. A display device according to claim 8, wherein the driving circuit and the pixel portion are formed on the same substrate integrally.

13. A display device according to claim 8, wherein the driving circuit and the pixel portion are formed on different substrates.

14. A display device according to claim 8, wherein the display device is selected from the group consisting of: a liquid crystal display, a personal computer, a portable information terminal, a car audio system and digital camera.

15. A display device having a driving circuit and a pixel portion,
    wherein the driving circuit has a scanning circuit and a selecting circuit,
    wherein the scanning circuit has a shift register, a level shifter, and a constant current source, the shift register sequentially outputting pulses in response to a clock signal, the level hitter converting the voltage amplitude of a signal inputted, the constant current source supplying a current to the level shifter,
    wherein the selecting circuit has a decoder that outputs a selecting pulse to an arbitrary terminal out of $2^n$ output terminals upon input of an n-bit selecting signal, and
    wherein the constant current source is operated only while the selecting pulse is inputted from the decoder to the constant current source,
    wherein the constant current source supplies a current to the level shifter while the constant current source is operated.

16. A display device according to claim 15, wherein a substrate selected from the group consisting of a glass substrate, a plastic substrate, a stainless steel substrate, an a single crystal wafer is provided.

17. A display device according to claim 15, wherein the driving circuit and the pixel portion are formed on the same substrate integrally.

18. A display device according to claim 15, wherein the driving circuit and the pixel portion are formed on different substrates.

19. A display device according to claim 15, wherein the display device is selected from the group consisting of: a liquid crystal display, a personal computer, a portable information terminal, a car audio system and digital camera.

20. A display device having a driving circuit and a pixel portion, wherein the driving circuit has a scanning circuit and a selecting circuit, wherein the scanning circuit has first to x-th stages of units (x stages in total, x is a natural number and satisfies $x \geq 2$), wherein the x stages of units each have a shift register, a level shifter, and a constant current source, the shift register sequentially outputting pulses in response to a clock signal, the level shifter converting the voltage amplitude of a signal inputted, the constant current source supplying a current to the level shifter, wherein the selecting circuit has a decoder that outputs a selecting pulse to an arbitrary terminal out of $2^n$ output terminals upon input of an n-bit selecting signal, wherein each of the plural output terminals of the decoder is connected to the constant current source in one of the units, with no two terminals being connected to the constant current source in the unit of the same stage, and wherein the constant current source in the a-th stage unit (a is a natural number and satisfies $1 \leq a \leq x$) is operated only while the selecting pulse is inputted from the decoder to the constant current source in the a-th stage unit, wherein the constant current source supplies a current to the level shifter while the constant current source is operated.

21. A display device according to claim 20, wherein a substrate selected from the group consisting of a glass substrate, a plastic substrate, a stainless steel substrate, and a single crystal wafer is provided.

22. A display device according to claim 20, wherein the driving circuit and the pixel portion are formed on the same substrate integrally.

23. A display device according to claim 20, wherein the driving circuit and the pixel portion are formed on different substrates.

24. A display device according to claim 20, wherein the display device is selected from the group consisting of: a liquid crystal display, a personal computer, a portable information terminal, a car audio system and digital camera.

25. A display device having a driving circuit and a pixel portion, wherein the driving circuit has a scanning circuit and a selecting circuit, wherein the scanning circuit has first to x-th stages of units (x stages in total, x is a natural number and satisfies $x \geq 2$), wherein the x stages of units each have a shift register, a level shifter, a constant current source, and a constant current source switch circuit, the shift register sequentially outputting pulses in response to a clock signal, the level shifter converting the voltage amplitude of a signal inputted, the constant current source supplying a current to the level shifter, the constant current source switch circuit inputting a pulse to the constant current source to control a current supply period and a current stop period, wherein the selecting circuit has a decoder that outputs a selecting pulse to an arbitrary terminal out of $2^n$ output terminals upon input of an n-bit selecting signal, wherein the constant current source switch circuit in the a-th stage unit (a is a natural number and satisfies $1 \leq a \leq x$) outputs a pulse to the constant current source in the a-th stage unit only while one of selecting pulses outputted from the decoder is inputted or an output pulse from the last stage shift register in the (a−1)-th unit is inputted, and wherein the constant current source in the a-th stage unit is operated only while a pulse is inputted from the constant current source switch circuit in the a-th stage unit, wherein the constant current source supplies a current to the level shifter while the constant current source is operated.

26. A display device according to claim 25, wherein a substrate selected from the group consisting of a glass substrate, a plastic substrate, a stainless steel substrate, and a single crystal wafer is provided.

27. A display device according to claim 25, wherein the driving circuit and the pixel portion are formed on the same substrate integrally.

28. A display device according to claim 25, wherein the driving circuit and the pixel portion are formed on different substrates.

29. A display device according to claim 25, wherein the display device is selected from the group consisting of: a liquid crystal display, a personal computer, a portable information terminal, a car audio system and digital camera.

* * * * *